(12) United States Patent
Hu et al.

(10) Patent No.: US 8,384,122 B1
(45) Date of Patent: Feb. 26, 2013

(54) TUNNELING TRANSISTOR SUITABLE FOR LOW VOLTAGE OPERATION

(75) Inventors: Chenming Hu, Oakland, CA (US);
Anupama Bowonder, Berkeley, CA (US); Pratik Patel, Berkeley, CA (US);
Daniel Chou, Houston, TX (US);
Prashant Majhi, Austin, TX (US)

(73) Assignee: The Regents of the University of California, Oakland, CA (US)

( * ) Notice: Subject to any disclaimer, the term of this patent is extended or adjusted under 35 U.S.C. 154(b) by 587 days.

(21) Appl. No.: 12/425,962

(22) Filed: Apr. 17, 2009

Related U.S. Application Data

(60) Provisional application No. 61/053,181, filed on May 14, 2008, provisional application No. 61/045,777, filed on Apr. 17, 2008.

(51) Int. Cl.
*H01L 29/66* (2006.01)

(52) U.S. Cl. ............ 257/105; 257/30; 257/39; 257/104; 257/E29.024; 257/E29.168

(58) Field of Classification Search .................... 257/12, 257/30, 39, 104, 105, 106, 192, E29.024, 257/E29.168
See application file for complete search history.

(56) References Cited

U.S. PATENT DOCUMENTS

| | | | | |
|---|---|---|---|---|
| 5,650,340 | A * | 7/1997 | Burr et al. ..................... | 438/286 |
| 5,732,014 | A * | 3/1998 | Forbes .......................... | 365/149 |
| 6,274,901 | B1 * | 8/2001 | Odake et al. .................. | 257/315 |
| 2004/0031996 | A1 * | 2/2004 | Brian Li et al. .............. | 257/408 |
| 2008/0050881 | A1 | 2/2008 | Chen et al. | |
| 2008/0067495 | A1 | 3/2008 | Verhulst | |

OTHER PUBLICATIONS

Antoniadis, D. A. et al., "Continuous MOSFET Performance Increase with Device Scaling: The Role of Strain and Channel Material Innovations," IBM J. Res. & Dev., Jul./Sep. 2006, pp. 363-376, vol. 50, No. 4/5, IBM.

Appenzeller, J. et al., "Band-toBand Tunneling in Carbon Nanotube Field-Effect Transistors," Physical Review Letters, Nov. 5, 2004, pp. 196805-1 to 196805-4, vol. 93, No. 19, The American Physical Society.

Aydin, C. et al, "Lateral Interband Tunneling Transistor in Silicon-on-Insulator," Applied Physics Letters, Mar. 8, 2004, pp. 1780-1782, vol. 84, No. 10, American Institute of Physics.

Bhuwalka, Krishna K. et al., "P-Channel Tunnel Field-Effect Transistors Down to Sub-50 nm Channel Lengths," Japanese Journal of Applied Physics, Apr. 25, 2006, pp. 3106-3109, vol. 45, No. 4B, The Japan Society of Applied.

Bhuwalka, Krishna Kumar et al., "Performance Enhancement of Vertical Tunnel Field-Effect Transistor with SiGe in the (delta)p+ Layer," Japanese Journal of Applied Physics, Jul. 7, 2004, pp. 4073-4078, vol. 43, No. 7A, The Japan Society of Applied Physics.

Bhuwalka, Krishna K et al., "Scaling the Vertical Tunnel FET With Tunnel Bandgap Modulation and Gate Workfunction Engineering," IEEE Transactions on Electron Devices, May 5, 2005, vol. 52, No. 5, IEEE.

(Continued)

*Primary Examiner* — Robert Huber
(74) *Attorney, Agent, or Firm* — Withrow & Terranova, PLLC

(57) ABSTRACT

Several embodiments of a tunneling transistor are disclosed. In one embodiment, a tunneling transistor includes a semiconductor substrate, a source region formed in the semiconductor substrate, a drain region formed in the semiconductor substrate, a gate stack including a metallic gate electrode and a gate dielectric, and a tunneling junction that is substantially parallel to an interface between the metallic gate electrode and the gate dielectric. As a result of the tunneling junction that is substantially parallel with the interface between the metallic gate electrode and the gate dielectric, an on-current of the tunneling transistor is substantially improved as compared to that of a conventional tunneling transistor. In another embodiment, a tunneling transistor includes a heterostructure that reduces a turn-on voltage of the tunneling transistor.

18 Claims, 23 Drawing Sheets

OTHER PUBLICATIONS

Boucart, Kathy et al., "Lateral Strain Profile as Key Technology Booster for All-Silicon Tunnel FETs," IEEE Electron Device Letters, Jun. 2009, pp. 656-658, vol. 30, No. 6, IEEE.

Chan, T. Y. et al., "The Impact of Gate-Induced Drain Leakage Current on MOSFET Scaling," Technical Digest of the 1987 International Electron Devices Meeting, 1987, current version available Aug. 9, 2005, pp. 718-721, vol. 31, No. 3, IEEE.

Choi, Woo Young et al., "70-nm Impact-Ionization Metal-Oxide-Semiconductor (I-MOS) Devices Integrated with Tunneling Field-Effect Transistors (TFETs)," IEDM Technical Digest of the IEEE International Electron Devices Meeting, Dec. 5, 2005, pp. 955-958, IEEE.

Choi, Woo Young et al., "Tunneling Field-Effect Transistors (TFETs) With Subthreshold Swing (SS) Less Than 60 mV/dec," IEEE Electron Device Letters, Aug. 2007, pp. 743-745, vol. 28, No. 8, IEEE.

Gusev, E. P. et al., "Advanced high-K Dielectric Stacks with PolySi and Metal Gates: Recent Progress and Current Challenges," IBM J. Res. & Dev, Jul./Sep. 2006, pp. 387-410, vol. 50, No. 4/5, IBM.

Kane, E. O., "Zener Tunneling in Semiconductors," J. Phys. Chem. Solids, received May 4, 1959, revised Jul. 24, 1959, published Jan. 1960, pp. 181-188, vol. 12, No. 2, Pergamon Press.

Kazazis, D. et al., "Tunneling Field-Effect Transistor with Epitaxial Junction in Thin Germanium-on-Insulator," Applied Physics Letters, Jul. 2, 2009, pp. 263508-1 to 263508-3, vol. 94, No. 263508, American Institute of Physics.

Keyes, Robert W., "Explaining Strain: The Positive and Negative Effects of Elastic Strain in n-Silicon," IEEE Circuits & Devices Magazine, Sep. 2002, pp. 36-39, IEEE.

Krishnamohan, Tejas et al., "Double-Gate Strained-Ge Heterostructure Tunneling FET 9TFET) with Record High Drive Currents and <60m V/dec Subthreshold Slope," IEEE International Electron Devices Meeting, Dec. 15-17, 2008, pp. 1-3, IEEE.

Mayer, F. et al., "Impact of SOI, Si1-xGexOI and GeOI substrates on CMOS compatible Tunnel FET performance," IEEE International Electron Devices Meeting, Dec. 15-17, 2008, pp. 1-5, IEEE.

Mookerjea, S. et al., "Experimental Demonstration of 100nm Channel Length In0.53Ga0.47As-based Vertical Inter-band Tunnel Field Effect Transistors (TFETs) for Ultra Low-Power Logic and SRAM Applications," IEEE International Electron Devices Meeting (IEDM), Dec. 7-9, 2009, pp. 1-3, IEEE.

Nayfeh, Osama M. et al., "Design of Tunneling Field-Effect Transistors Using Strained-Silicon/Strained-Germanium Type-II Staggered Heterojunctions," IEEE Electron Device Letters, Sep. 2008, pp. 1074-1077, vol. 29, No. 9, IEEE.

Nirschl, TH. et al., "Correction to Revision of Tunneling Field-Effect Transistor in Standard CMOS Technologies," IEEE Electron Device Letters, Apr. 2007, p. 315, vol. 28, No. 4, IEEE.

Reddick, William M. et al., "Silicon Surface Tunnel Transistor," Appl. Phys. Lett., Jul. 24, 1995, pp. 494-496, vol. 67, No. 4, American Institute of Physics.

Thompson, Scott E. et al., "A 90-nm Logic Technology Featuring Strained-Silicon," IEEE Transactions on Electron Devices, Nov. 2004, pp. 1790-1797, vol. 51, No. 11, IEEE.

Wong, H.-S. P., "Beyond the Conventional Transistor," IBM J. Res. & Dev. Mar./May 2002, pp. 133-168, vol. 46, No. 2/3, IBM.

* cited by examiner

| BANDGAP | $V_{DD}$ V | $I_{ON}$ µA/µm | $I_{OFF}$ A/µm | CV/I pS |
|---|---|---|---|---|
| 1.12 | 1.0 | 776 | 1E-10 | 2.22 |
| 0.69 | 0.5 | 703 | 5E-11 | 1.76 |
| 0.36 | 0.2 | 1152 | 3E-10 | 0.42 |

TUNNELING TRANSISTOR SUITABLE FOR LOW VOLTAGE OPERATION

PRIORITY

This application claims the benefit of U.S. provisional application Ser. No. 61/045,777 filed Apr. 17, 2008 and U.S. provisional application Ser. No. 61/053,181 filed May 14, 2008, the disclosures of which are hereby incorporated herein by reference in their entireties.

GOVERNMENTAL RIGHTS

This invention was made with government support under Contract Number HR0011-07-3-0002 awarded by DARPA. The Government has certain rights in the invention.

FIELD OF THE DISCLOSURE

The present invention relates to a tunneling transistor.

BACKGROUND OF THE INVENTION

The maximum integration density of modern integrated circuits (ICs) is limited by the amount of power or heat dissipated per unit area. In order to increase the device integration density, the power dissipation per device must be reduced steadily with time. An important method of reducing the device power consumption is to reduce the power supply voltage ($V_{DD}$). Reducing $V_{DD}$ can decrease both the dynamic power consumption and the standby power consumption of future ICs. Device on-state current must be sufficiently large in order to achieve good circuit speed. Device off-current must be sufficiently small in order to suppress the standby power consumption. It is well known to those skilled in the art that the Metal Oxide Semiconductor Field Effect Transistor (MOSFET), the device driving today's ICs, is limited in the ratio of on-state to off-state currents, $I_{ON}/I_{OFF}$, when $V_{DD}$ is small. When $V_{DD}$ is small, a new transistor requiring smaller changes in the input voltage to effect a tenfold increase in the transistor current, a quantity called "swing" or "S" and measured in millivolts (mV)/decade, is highly desirable because the maximum change in the input voltage is normally equal to $V_{DD}$. This requires an operating principle other than the passage of charge carriers over a potential barrier—the operating principle behind both MOSFETs and bipolar transistors. This operating principal behind both MOSFETs and bipolar transistors sets a floor of 60 mV/decade to the swing achievable at room temperature.

Various researchers have explored tunneling transistors. Tunneling transistors are transistors that operate based on a principle involving charge carriers tunneling under or passing through, rather than over, a potential barrier. Therefore, tunneling transistors are not subject to the 60 mV/decade limitation to swing. FIG. 1 illustrates a conventional tunneling transistor 10. In general, the conventional tunneling transistor 10 includes a substrate 12, an N+ source 14 and a P+ drain 16 formed in the substrate 12, and a gate stack 18 arranged as shown. The gate stack 18 may also be referred to as a gate. The gate stack 18 is generally formed of a metallic gate electrode 20 and a gate dielectric 22 arranged as shown. A p-type channel (a portion of the p-type substrate 12 between the N+ source 14 and the P+ drain 16) and the N+ source 14 form a gated PN diode. When this gated PN diode is reverse biased by applying a negative gate-to-source voltage ($V_{GS}$), a tunneling current occurs at a vertical tunneling junction 24.

The conventional tunneling transistor 10 has at least two issues. First, best on-current ($I_{ON}$) reports for the conventional tunneling transistor 10 have been withdrawn. Remaining valid experiments have all shown that the on-current NO of the conventional tunneling transistor 10 is too low for general applications. Second, a large gate voltage is needed to turn on the conventional tunneling transistor 10. As such, there is a need for a new tunneling transistor having a suitable on-current ($I_{ON}$) for modern applications. There is also a need for a new tunneling transistor having a reduced turn-on voltage and is therefore capable of operating at lower supply voltage, or $V_{DD}$, levels.

SUMMARY OF THE DETAILED DESCRIPTION

Several embodiments of a tunneling transistor are disclosed. In one embodiment, a tunneling transistor includes a semiconductor substrate, a source region formed in the semiconductor substrate, a drain region formed in the semiconductor substrate, a gate stack including a metallic gate electrode and a gate dielectric, and a tunneling junction that is substantially parallel to an interface between the metallic gate electrode and the gate dielectric. As a result of the tunneling junction that is substantially parallel with the interface between the metallic gate electrode and the gate dielectric, an on-current of the tunneling transistor is substantially improved as compared to that of a conventional tunneling transistor.

In one embodiment, a tunneling transistor includes a semiconductor substrate, a source region formed in the semiconductor substrate, a drain region formed in the semiconductor substrate, and a gate stack that overlaps a portion of the source region and includes a metallic gate electrode and a gate dielectric. In addition, the tunneling transistor includes a pocket formed at a surface of the source region such that the pocket is substantially aligned with a portion of the gate stack. In one embodiment, the source region and the pocket are of opposite doping types. In another embodiment, the source region is a metallic source region, and the pocket is formed of a semiconductor material having a desired doping type. The pocket is formed such that a junction between the source region and the pocket provides a parallel tunneling junction that is substantially parallel to an interface between the metallic gate electrode and the gate dielectric. As a result of the parallel tunneling junction, an on-current of the tunneling transistor is substantially improved as compared to that of a conventional tunneling transistor.

In one embodiment, a tunneling transistor includes a semiconductor substrate, a source region formed in the semiconductor substrate, a drain region formed in the semiconductor substrate, a gate stack including a metallic gate electrode and a gate dielectric, and a tunneling junction that is substantially parallel to an interface between the metallic gate electrode and the gate dielectric. In one embodiment, the drain region is formed by doping the semiconductor substrate. In another embodiment, the drain region is a metallic drain.

In one embodiment, a tunneling transistor includes a semiconductor substrate, a source region formed in the semiconductor substrate, a drain region formed in the semiconductor substrate, and a gate stack including a metallic gate electrode and a gate dielectric. In this embodiment, the gate dielectric is formed of a high-k dielectric material. Further, in this embodiment, the tunneling transistor includes a tunneling junction. The tunneling junction may be substantially parallel to an interface between the metallic gate electrode and the gate dielectric or substantially perpendicular to the metallic gate electrode and the gate dielectric.

In one embodiment, a tunneling transistor includes a semiconductor substrate, a source region formed in the semiconductor substrate, a drain region formed in the semiconductor substrate, and a gate stack including a metallic gate electrode and a gate dielectric. In this embodiment, the semiconductor substrate includes a semiconductor material having a band gap of less than 1.12 electron volts (eV). For example, the semiconductor material may be Germanium (Ge), Indium Gallium Arsenide (InGaAs), or Indium Arsenide (InAs). Further, in this embodiment, the tunneling transistor includes a tunneling junction. The tunneling junction may be substantially parallel to an interface between the metallic gate electrode and the gate dielectric or substantially perpendicular to the metallic gate electrode and the gate dielectric.

In one embodiment, a tunneling transistor includes a semiconductor substrate, a source region formed in the semiconductor substrate, a drain region formed in the semiconductor substrate, and a gate stack including a metallic gate electrode and a gate dielectric. In this embodiment, the drain region is a metallic drain region. Further, in this embodiment, the tunneling transistor includes a tunneling junction. The tunneling junction may be substantially parallel to an interface between the metallic gate electrode and the gate dielectric or substantially perpendicular to the metallic gate electrode and the gate dielectric.

In one embodiment, a tunneling transistor includes a semiconductor substrate, a source region formed in the semiconductor substrate, a drain region formed in the semiconductor substrate, and a gate stack including a metallic gate electrode and a gate dielectric. A region of the semiconductor substrate between the source region and the drain region forms a channel region. In this embodiment, the source region and the channel region are of the same doping type, and the source region is electrically isolated from the channel region by an isolation region having an opposite doping type from that of the channel region. Further, in this embodiment, the tunneling transistor includes a tunneling junction. The tunneling junction may be substantially parallel to an interface between the metallic gate electrode and the gate dielectric or substantially perpendicular to the metallic gate electrode and the gate dielectric.

In another embodiment, a tunneling transistor includes a heterostructure including a first semiconductor material and a second semiconductor material, a source region formed in the heterostructure, a drain region, a channel region between the source region and the drain region, and a gate stack including a metallic gate electrode and a gate dielectric. A metallurgical junction between the first and second semiconductor materials in the heterostructure is substantially parallel to an interface between the metallic gate electrode and the gate dielectric. The first and second semiconductor materials are selected such that an effective band gap of the heterostructure is less than a band gap of either the first semiconductor material or the second semiconductor material. As a result, a gate-to-source voltage ($V_{GS}$) needed to turn on the tunneling transistor is reduced.

In another embodiment, a tunneling transistor includes a heterostructure of a first semiconductor material and a second semiconductor material, a source region formed in the heterostructure, a drain region, a channel region between the source region and the drain region, and a gate stack including a metallic gate electrode and a gate dielectric. A metallurgical junction between the first and second semiconductor materials in the heterostructure is substantially parallel to an interface between the metallic gate electrode and the gate dielectric. The first and second semiconductor materials are selected such that an effective band gap of the heterostructure is less than a band gap of either the first semiconductor material or the second semiconductor material. As a result, a gate-to-source voltage ($V_{GS}$) needed to turn on the tunneling transistor is reduced. In addition, in this embodiment, the gate stack overlaps a portion of the source region, and the first and second semiconductor materials are doped of opposite doping types, or opposite conductivity. As a result, an on-current of the tunneling transistor is substantially improved.

In another embodiment, a tunneling transistor includes a heterostructure of a first semiconductor material and a second semiconductor material, a source region formed in the heterostructure, a drain region, a channel region between the source region and the drain region, and a gate stack including a metallic gate electrode and a gate dielectric. A metallurgical junction between the first and second semiconductor materials in the heterostructure is substantially in parallel with an interface between the metallic gate electrode and the gate dielectric. The first and second semiconductor materials are selected such that an effective band gap between the first and second semiconductor materials is less than a band gap of either the first semiconductor material or the second semiconductor material. As a result, a gate-to-source voltage ($V_{GS}$) needed to turn on the tunneling transistor is reduced. In addition, in this embodiment, a pocket of opposite doping type, or opposite conductivity, than the source region is formed either in the source region or adjacent to and adjoining the source region in the first semiconductor material. As a result of the pocket, an on-current of the tunneling transistor is substantially improved.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

Figure 1:
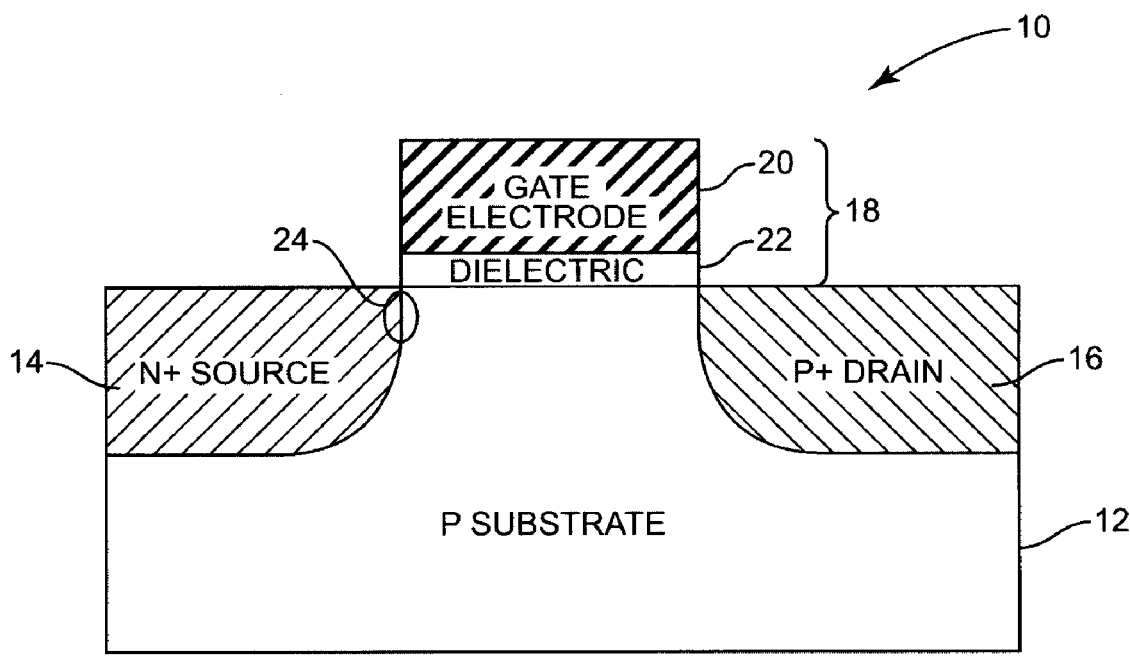
FIG. 1 illustrates a conventional tunneling transistor.
Figure 2A:
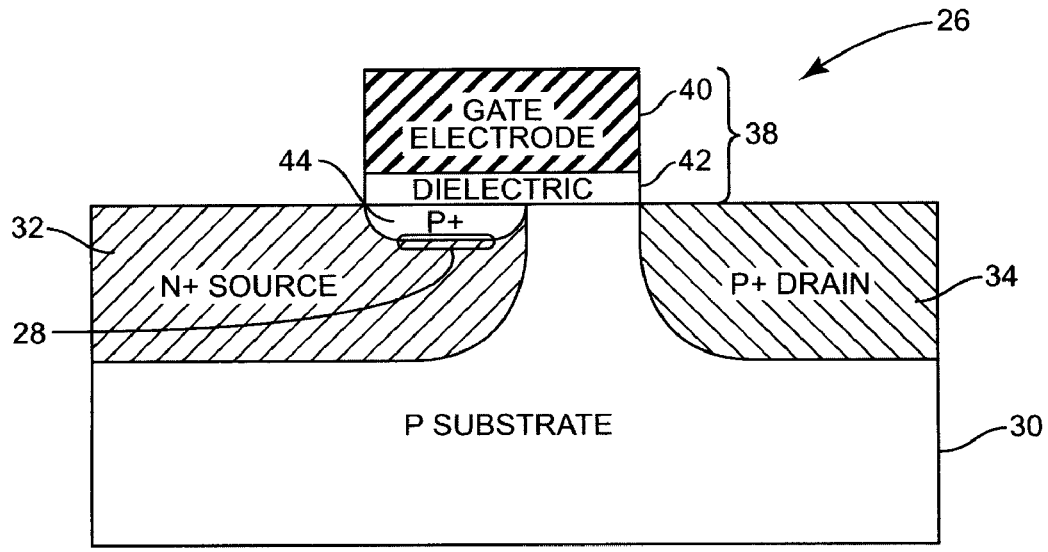
FIGS. 2A and 2B illustrate a tunneling transistor having a parallel tunneling junction according to one embodiment of this disclosure.
Figure 2B:
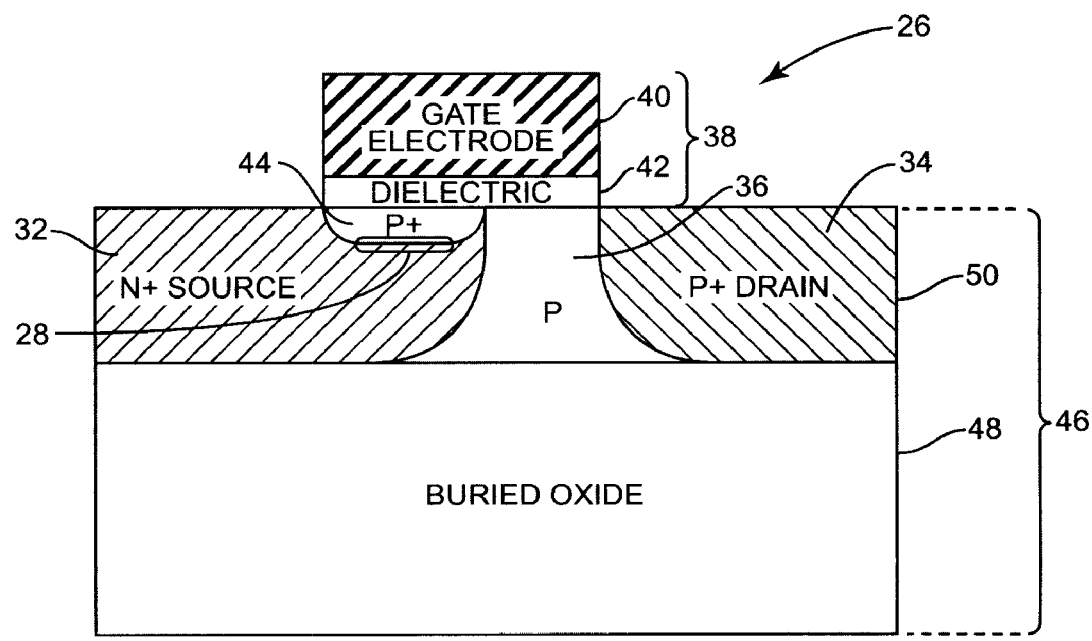

This disclosure relates to several embodiments of a tunneling transistor that improve an on-current of the tunneling transistor, reduce a gate-to-source voltage ($V_{GS}$) needed to turn on the tunneling transistor and thus a supply voltage ($V_{DD}$) needed to operate the tunneling transistor, or both. FIGS. 2A and 2B illustrate a tunneling transistor 26 having a parallel tunneling junction 28 according to one embodiment of this disclosure. Because of the parallel tunneling junction 28, an on-current of the tunneling transistor 26 is substantially improved as compared to that of the conventional tunneling transistor 10 (FIG. 1). In addition, the high on-current of the tunneling transistor 26 can be provided at supply voltage levels less than 1 volt (V), as described below in detail.

As illustrated in FIG. 2A, the tunneling transistor 26 may be fabricated on a bulk semiconductor substrate 30. The tunneling transistor 26 may be referred to herein as a green Field Effect Transistor (gFET) or a Parallel Junction Tunneling Transistor (PJTT). In this embodiment, the tunneling transistor 26 includes an N+ source region 32, a P+ drain region 34, a channel region 36, and a gate stack 38, or gate, formed over the channel region 36 and a portion of the N+ source region 32. The gate stack 38 includes a metallic gate electrode 40 and a gate dielectric 42 arranged as shown. Note that the gate stacks discussed herein each include a metallic gate electrode and a gate dielectric. However, in some embodiments, the gate stacks may include additional layers such as, for example, a passivation layer between the gate dielectric and the semiconductor surface. In addition, in this embodiment, a P+ pocket 44 is formed in the N+ source region 32. The P+ pocket 44 is floating. More specifically, the P+ pocket 44 is formed at the surface of the portion of the N+ source region 32 overlapped by the gate stack 28.

The PN junction between the P+ pocket 44 and the N+ source 32 provides the parallel tunneling junction 28. The parallel tunneling junction 28 is substantially parallel to an interface between the metallic gate electrode 40 and the gate dielectric 42. In other words, the parallel tunneling junction 28 is substantially parallel to an interface between the gate stack 38 and the N+ source region 32 including the P+ pocket 44. In addition, the parallel tunneling junction 28 is substantially aligned with the portion of the gate stack 38 that overlaps the N+ source region 32. In one embodiment, the P+ pocket 44 has a doping level greater than $10^{18}$ atoms/cm$^3$, the N+ source region 32 has a doping level greater than $10^{18}$ atoms/cm$^3$, and the channel region 36 has a doping level less than $10^{19}$ atoms/cm$^3$.

By applying a negative gate-to-source voltage ($V_{GS}$) to the tunneling transistor 26, a reverse bias is applied to a PN diode formed by the P+ pocket 44 and the N+ source region 32. The negative $V_{GS}$ pulls down the potential of the floating P+ pocket 44 and causes electron tunnelling from the P+ pocket 44 to the N+ source region 32. The holes left behind (generated) in the P+ pocket 44 are swept to the P+ drain region 34 as the drain current. As a result of the parallel tunnelling junction 28, the negative $V_{GS}$ results in a large and uniform electric field being applied to one side of the parallel tunnelling junction 28, namely, the P+ pocket 44 of the P+/N+ structure formed by the P+ pocket 44 and the N+ source region 32. This is in stark contrast to the vertical tunnelling junction 24 (FIG. 1) of the conventional tunnelling transistor 10 (FIG. 1) where the electric field is applied to both sides of the vertical tunnelling junction 24. In addition, an area of the parallel tunnelling junction 28 is enabled to be substantially larger than that of the vertical tunnelling function 24 of the conventional tunnelling transistor 10. Because of the large and uniform electric field being applied to the P+ pocket 44 side of the parallel tunnelling junction 28 and the relatively large area of the parallel tunnelling junction 28, a large tunnelling current, or on-current ($I_{ON}$), is produced.

FIG. 2B illustrates the tunnelling transistor 26 fabricated on a Semiconductor On Insulator (SOI) substrate 46, rather than the bulk semiconductor substrate 30 of FIG. 2A. The SOI substrate 46 includes a buried oxide layer 48 and a semiconductor layer 50 arranged as shown. Otherwise, the tunnelling transistor 26 is the same as discussed above with respect to FIG. 2A.

Figure 3:
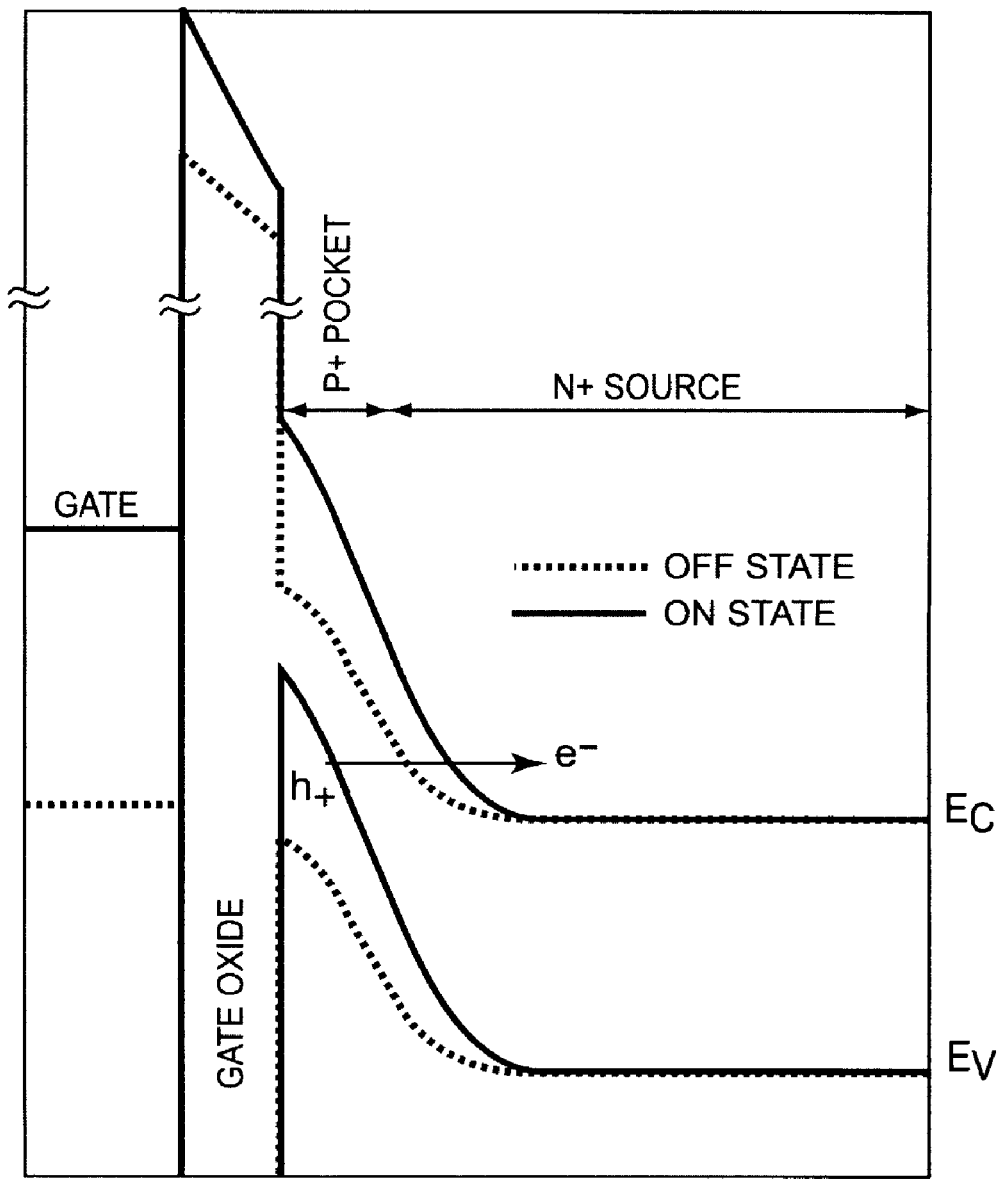
FIG. 3 is an energy band diagram for the tunneling transistor of FIGS. 2A and 2B illustrating electron tunneling.

FIG. 3 is an energy band diagram for the tunnelling transistor 26 of FIGS. 2A and 2B for both the on-state and the off-state of the tunnelling transistor 26. In this embodiment, the tunnelling transistor 26 is in the on-state when a negative $V_{GS}$ is applied and is otherwise in the off-state. The magnitude of the negative $V_{GS}$ needed to turn on the tunnelling transistor 26 may vary depending on a number of factors such as the band gap of the semiconductor material used, the dielectric constant of the gate dielectric 42, and the like. As an example, for Silicon (band gap of 1.12 electron volts (eV)) and an effective oxide thickness of 10 Angstroms for the gate dielectric 42, the turn-on voltage for the tunnelling transistor 26 is approximately 1 V (i.e., $V_{GS}$=−1 V). The tunnelling transistor 26 may be placed in the off-state by applying a $V_{GS}$ of 0 V.

As illustrated in FIG. 3, in the off-state, there is no or little overlap of the valence band ($E_V$) for the P+ pocket 44 and the conduction band ($E_C$) of the N+ source region 32. As such, electrons are unable to tunnel from the P+ pocket 44 to the N+ source region 32. However, when in the on-state, the large uniform electric field generated by a capacitive coupling between the gate stack 38 and the P+ pocket 44 shifts the valence band ($E_V$) and the conduction band ($E_C$) for the P+ pocket 44 up such that there is substantial overlap between the valence band ($E_V$) of the P+ pocket 44 and the conduction band ($E_C$) of the N+ source region 32. As a result, a path for electron tunneling from the valence band ($E_V$) of the P+ pocket 44 to the conduction band ($E_C$) of the N+ source region 32 is created, as represented by a corresponding arrow in FIG. 3. As illustrated, tunneling generates, or leaves behind, holes in the P+ pocket 44.

Figure 4:
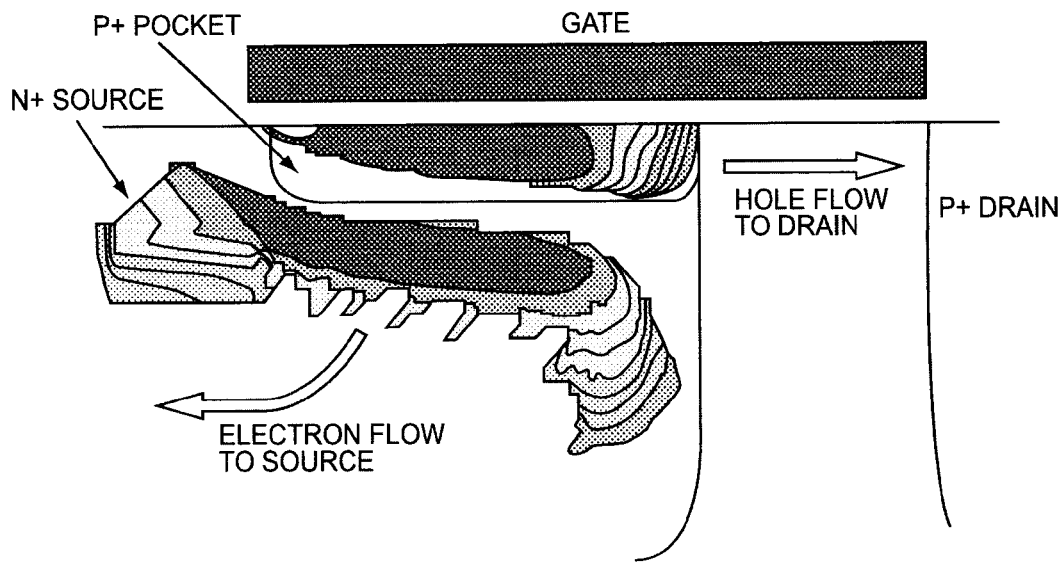
FIG. 4 is a contour diagram illustrating electron and hole flow resulting from tunneling in the tunneling transistor of FIGS. 2A and 2B.

FIG. 4 is a contour plot of tunneling rate ($s^{-1}$ $cm^{-3}$) for the tunneling transistor 26 of FIGS. 2A and 2B. As illustrated, tunneling tends to originate from the P+ pocket 44 and end in the N+ source region 32. Contours within the P+ pocket 44 illustrate the rate of generation of holes in the P+ pocket 44 as a result of electron tunneling from the valence band ($E_V$) of the P+ pocket 44 to the conduction band ($E_C$) of the N+ source region 32. These holes flow to the P— drain region 34 as the drain current. Contours within the N+ source region 32 illustrate the rate of electron tunneling into the N+ source region 32 from the P— pocket 44. Together, the electron and hole flow complete the on-current path from source to drain. Note that in the off-state, there is no available tunnelling path and no hole generation. In the off-state, the floating P+ pocket 44 cannot supply holes to carry a drain current. Hence, the on-current suddenly drops with millivolt (mV) swing.

Figure 5:
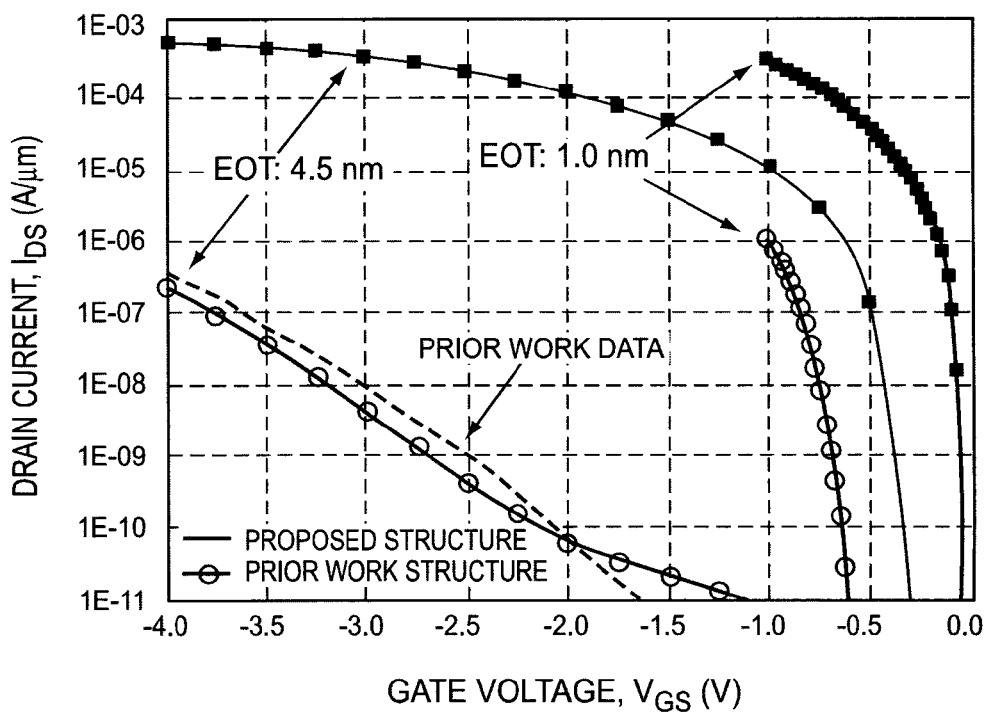
FIG. 5 is a graph illustrating an improvement of drain-to-source current ($I_{DS}$) versus source-to-gate voltage ($V_{GS}$) for the tunneling transistor of FIGS. 2A and 2B as compared to that of the conventional tunneling transistor of FIG. 1.

FIG. 5 is a graph of drain current ($I_{DS}$) versus $V_{GS}$ for exemplary embodiments of the tunneling transistor 26 of FIGS. 2A and 2B as compared to that of the conventional tunneling transistor 10 (FIG. 1). As illustrated, the tunneling transistor 26 can produce much larger tunneling current. In this comparison, the operation voltage is relatively large in order to match the voltage level traditionally employed. As discussed below, the use of low band gap semiconductor material and/or scaling of dimensions such as the use of high-k dielectrics can reduce the operation voltage.

The tunneling transistor 26 achieves superior performance for several reasons. First, unlike in the conventional tunneling transistor 10 (FIG. 1) which has the vertical tunneling junction 24, $V_{GS}$ does not pull down the surface potential of the N+ source region 32 of the tunneling transistor 26 directly, which maximizes the tunneling field. As a result, the tunneling transistor 26 provides a larger current than the conventional tunneling transistor 10. In addition, the relatively large N+/P+ provides a much larger tunneling area than the conventional tunnel transistor 10. Still further, the heavily doped P+ pocket 44 under the gate stack 38 lowers the turn-on voltage of the tunneling transistor 26 as compared to that of the conventional tunneling transistor 10. More specifically, a finite amount of gate turn-on voltage is required to bend the energy band of the P+ pocket 44 until there is substantial overlap of states between the valence band ($E_V$) of the P+ pocket 44 and the conduction band ($E_C$) of the N+ source region 32 permitting tunneling. In the tunneling transistor 26, the doping concentration and the thickness of the P+ pocket 44 can lower turn-on voltage similar to the way channel doping concentration affects the threshold voltage of a Metal Oxide Semiconductor Field Effect Transistor (MOSFET). FIG. 5 clearly shows the lower turn-on voltage.

Figure 6A:
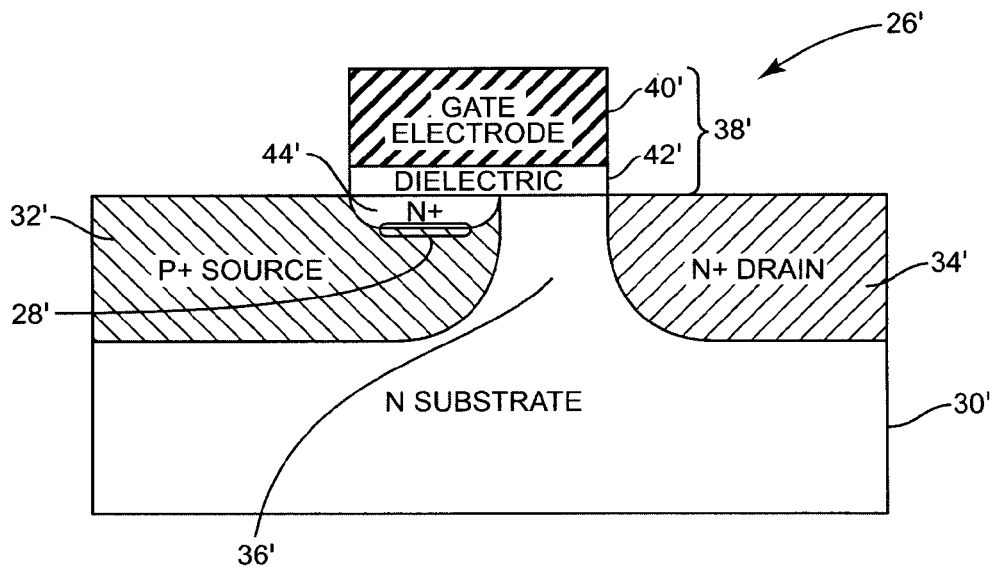
FIGS. 6A and 6B illustrate an n-channel tunneling transistor similar to that of FIGS. 2A and 2B according to one embodiment of this disclosure.
Figure 6B:
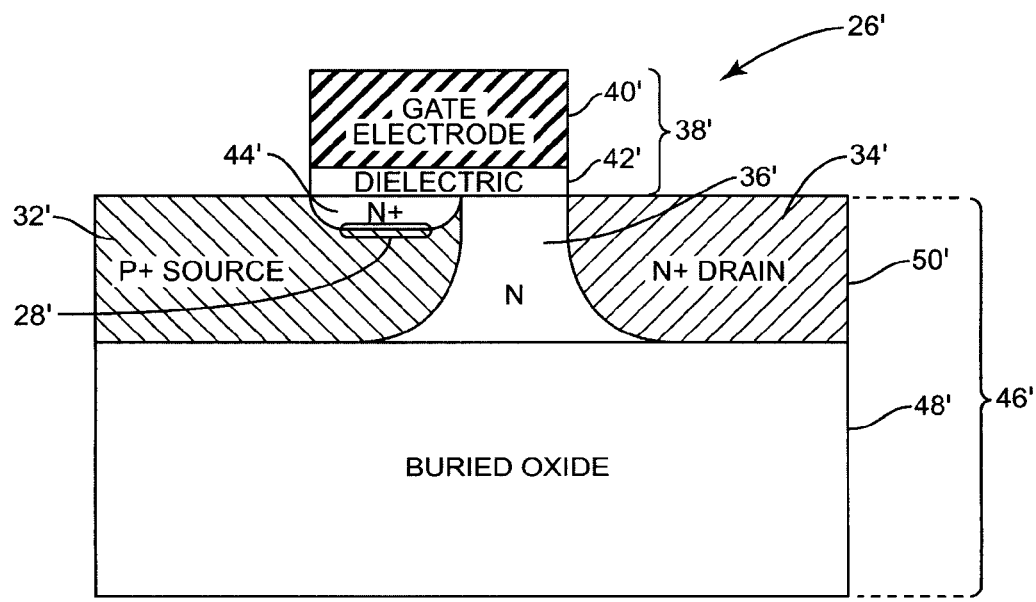

FIGS. 6A and 6B illustrate n-channel embodiments of the tunneling transistor 26, which for FIGS. 6A and 6B is referred to as a tunneling transistor 26'. The tunneling transistor 26' of FIGS. 6A and 6B is substantially the same as the tunneling transistor 26 of FIGS. 2A and 2B. More specifically, as illustrated in FIG. 6A, the tunneling transistor 26' may be fabricated on a bulk semiconductor substrate 30', which is this embodiment is an n-type substrate. In this embodiment, the tunneling transistor 26' includes a P+ source region 32', an N+ drain region 34', a n-type channel region 36', and a gate stack 38', or gate, formed over the channel region 36' and a portion of the P+ source region 32'. The gate stack 38' includes a metallic gate electrode 40' and a gate dielectric 42' arranged as shown. In addition, in this embodiment, an N+ pocket 44' is formed in the P+ source region 32'. The N+ pocket 44' is floating. More specifically, the N+ pocket 44' is formed at the surface of the portion of the P+ source region 32' overlapped by the gate stack 38'. A PN junction between the P+ source region 32' and the N+ pocket 44' provides a parallel tunneling junction 28'. The parallel tunneling junction 28' is substantially parallel with an interface between the metallic gate electrode 40' and the gate dielectric 42'. In addition, the parallel tunneling junction 28' is substantially aligned with the portion of the gate stack 38' that overlaps the P+ source region 32'. In one embodiment, the N+ pocket 44' has a doping level greater than $10^{18}$ atoms/$cm^3$, the P+ source region 32' has a doping level greater than $10^{18}$ atoms/$cm^3$, and the channel region 36' has a doping level less than $10^{19}$ atoms/$cm^3$.

In this embodiment, by applying a positive gate-to-source voltage ($V_{GS}$) to the tunneling transistor 26', a reverse bias is applied to a PN diode formed by the P+ source region 32' and the N+ pocket 44'. The positive $V_{GS}$ pulls up the potential of the floating N+ pocket 44' and causes electron tunnelling from the P+ source region 32' to the N+ pocket 44'. The tunnelling electrons are swept to the N+ drain region 34' to create the drain current. The holes left behind (generated) in the P+ source region 32' form the source current.

FIG. 6B illustrates the tunnelling transistor 26' fabricated on a SOI substrate 46', rather than the bulk semiconductor substrate 30' of FIG. 6A. The SOI substrate 46' includes a buried oxide layer 48' and a semiconductor layer 50' arranged as shown. Otherwise, the tunnelling transistor 26' of FIG. 6B is the same as that described above with respect to FIG. 6A.

The tunnelling current, and thus a drain-to-source current ($I_{DS}$), can be increased and the turn-on voltage of the tunnelling transistor 26, 26' can be decreased via the use of low band gap materials. More specifically, the tunnelling probability may be defined as:

$$\text{Tunnelling Probability} = A\exp(-B/E), \quad \text{Eq. (1)}$$

where E is the electric field (controlled by $V_{GS}$) and B is proportional to the band gap of the semiconductor material to the 3/2 power and effective mass to the 1/2 power. While the small band gap itself does not benefit the MOSFET, the small band gap and effective-mass engineering give gFET a potential path for $V_{DD}$ scaling. It should be noted that small effective-mass or density of states would adversely affect A in Eq. (1).

Figures 7, 8:
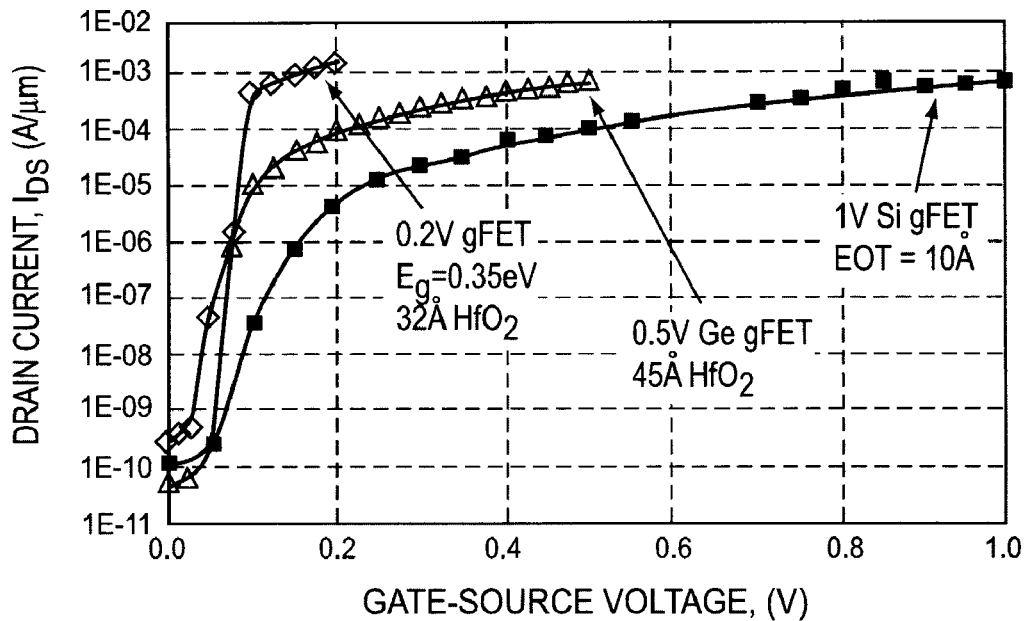
FIG. 7 is a graph illustrating $I_{DS}$ versus $V_{GS}$ for the tunneling transistor of FIGS. 6A and 6B for a number of semiconductor materials having different band gaps.
FIG. 8 is a table illustrating supply voltage ($V_{DD}$), on-current ($I_{ON}$), off-current ($I_{OFF}$), and CV/I for the tunneling transistor of FIGS. 6A and 6B for each of a number of semiconductor materials having different band gaps.

FIG. 7 is a graph of drain-to-source current ($I_{DS}$) versus $V_{GS}$ for the tunneling transistor 26' for each of a number of semiconductor materials having different band gaps. As illustrated, as lower band gap materials are used, the drain-to-source current ($I_{DS}$) increases, and the turn-on voltage decreases. Note that the same is true for the p-channel tunneling transistor 26. More specifically, when Silicon (Si) is replaced with Germanium (Ge), the drain-to-source current ($I_{DS}$) remains about the same, but the turn-on voltage drops from about 1 V to about 0.5 V. Further, if a 0.36 eV band gap semiconductor material is used, the drain-to-source current ($I_{DS}$) increases, and the turn-on voltage drops to about 0.2 V. Thus, scaling to 0.2 V $V_{DD}$ with good $I_{ON}$ and $I_{OFF}$ is shown. Thermal-generation leakage, which increases with reduced band gap, is included. Also note that at $V_{DD}$=0.2 V, the tunnelling transistor 26 using the 0.36 eV semiconductor material produces 1.15 milliamp/micrometer (mA/μm) $I_{ON}$ and a drain current ($I_{DS}$) that decreases by about six orders of magnitude when $V_{GS}$ decreases from about 95 mV to about 30 mV. FIG. 8 is a table summarizing FIG. 7 and including calculated CV/I values. Thus, using a suitable low band gap material, or a comparable heterostructure (see below), the tunneling transistor 26, 26' can provide ~mA/μm $I_{ON}$ and <nA/μm $I_{OFF}$ at $V_{DD}$ as low as 0.2V. This would reduce power, which is proportional to $V_{DD}^2$, by more than 10×.

Note that the on-current ($I_{ON}$), and thus $I_{DS}$, of the tunnelling transistor 26, 26' can be further increased by reducing the resistance of the channel region 36, 36'. This may be done by doping at least a surface region of the channel region 36, 36' with a dopant of the same type as the drain region 34, 34'. In a conventional MOSFET, the channel dopant is of the opposite type as the drain; doing otherwise would prevent the transistor from being turned off at $V_{GS}$=0. The tunneling transistor 26, 26' relies on the tunneling junction design to set the turn-off voltage, not the channel doping. This fact allows increase of the channel conductance by employing the same dopant type in the channel region 36, 36' as in the drain region 34, 34'.

Figure 9:
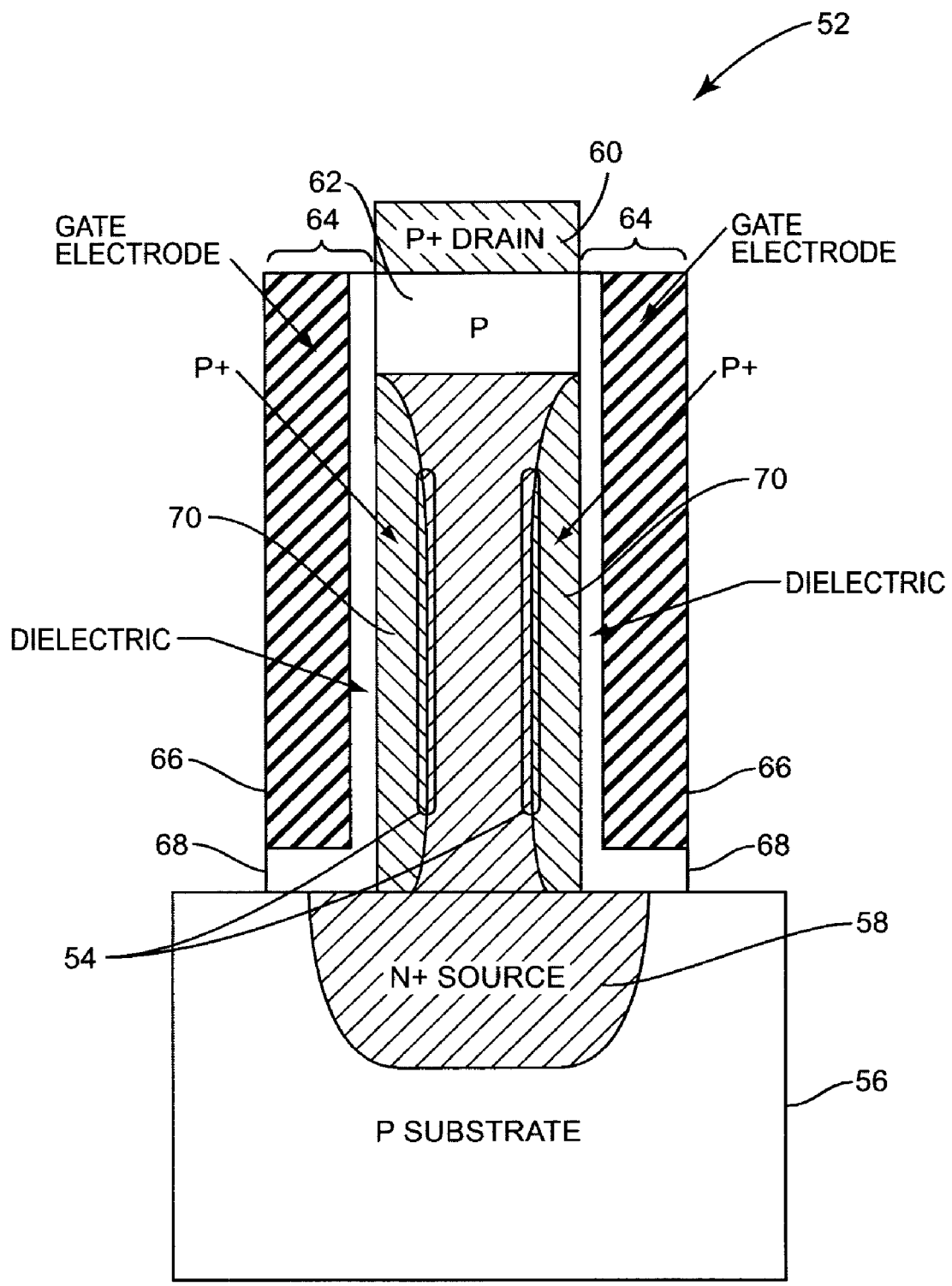
FIG. 9 illustrates a 3-Dimensional (3-D) embodiment of a tunneling transistor having a parallel tunneling junction according to one embodiment of this disclosure.

The tunneling current in the tunneling transistor 26, 26' is proportional to the tunneling area (i.e., an area of the parallel tunneling junction 28, 28'). As such, $I_{DS}$ can be further increased by increasing the tunneling area. FIG. 9 illustrates a tunneling transistor 52 including a parallel tunneling junction 54 having an increased tunneling area according to one embodiment of this disclosure. As illustrated, the tunneling transistor 52 includes a substrate 56, a N+ source region 58, a P+ drain region 60, a p-type channel region 62, and a gate stack 64 including a metallic gate electrode 66 and a gate dielectric 68, arranged as shown. A P+ pocket 70 is formed in a portion of the N+ source region 58 as shown. The P+ pocket 70 is formed such that a junction between the P+ pocket 70 and the N+ source region 58 forms the parallel tunneling junction 54 that is substantially parallel to an interface between the metallic gate electrode 66 and the gate dielectric 68. In other words, the metallic gate electrode 66 is substantially parallel to an interface between the gate stack 64 and the N+ source region 58. In addition, the parallel tunneling junction 54 is substantially aligned with the portion of the gate stack 64 overlapping the N+ source region 58. In this example, the tunneling transistor 52 is a 3-D structure, wherein the gate stack 64 circumscribes or substantially circumscribes a portion of the N+ source region 58 including the P+ pocket 70. The tunneling transistor 52 of FIG. 9 is referred to herein as a 3-D structure. As a result of the 3-D structure, the area of the parallel tunneling junction 54 is substantially increased, which in turn substantially increases the on-current ($I_{ON}$) of the tunneling transistor 52.

Figure 10:
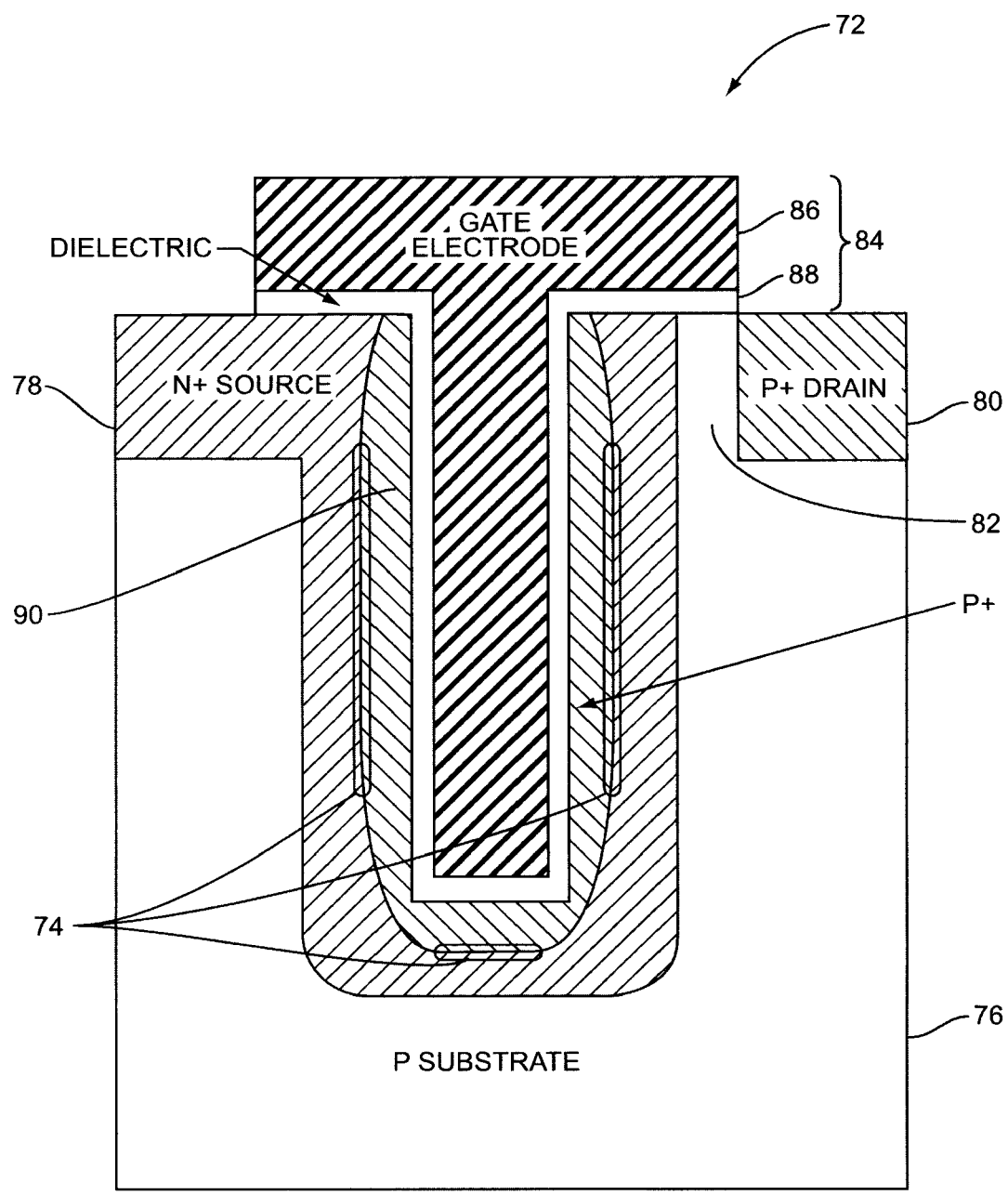
FIG. 10 illustrates a 3-D embodiment of a tunneling transistor having a parallel tunneling junction according to another embodiment of this disclosure.

FIG. 10 illustrates a tunneling transistor 72 that includes a parallel tunneling junction 74 having an increased tunneling area according to another embodiment of this disclosure. This embodiment is similar to that of FIG. 9. However, rather than extending up from a substrate, the tunneling transistor 72 is formed by burrowing into a substrate 76. As illustrated, the tunneling transistor 72 includes a substrate 76, an N+ source region 78, a P+ drain region 80, a p-type channel region 82, and a gate stack 84 including a metallic gate electrode 86 and a gate dielectric 88, arranged as shown. A P+ pocket 90 is formed in a portion of the N+ source region 78 as shown. The P+ pocket 90 is formed such that a junction between the P+ pocket 90 and the N+ source region 78 forms the parallel tunneling junction 74 that is substantially parallel to an interface between the metallic gate electrode 86 and the gate dielectric 88. In other words, the parallel tunneling junction 74 is substantially parallel to an interface between the metallic gate electrode 86 and the N+ source region 78. In this example, the tunneling transistor 72 is a 3-D structure, wherein a portion of the gate stack 84 is circumscribed or substantially circumscribed by a portion of the N+ source region 78 including the P+ pocket 90. The tunneling transistor 72 of FIG. 10 is referred to herein as a 3-D structure. As a result of the 3-D structure, the area of the parallel tunneling junction 74 is substantially increased, which in turn substantially increases the on-current ($I_{ON}$) of the tunneling transistor 72.

Figure 11:
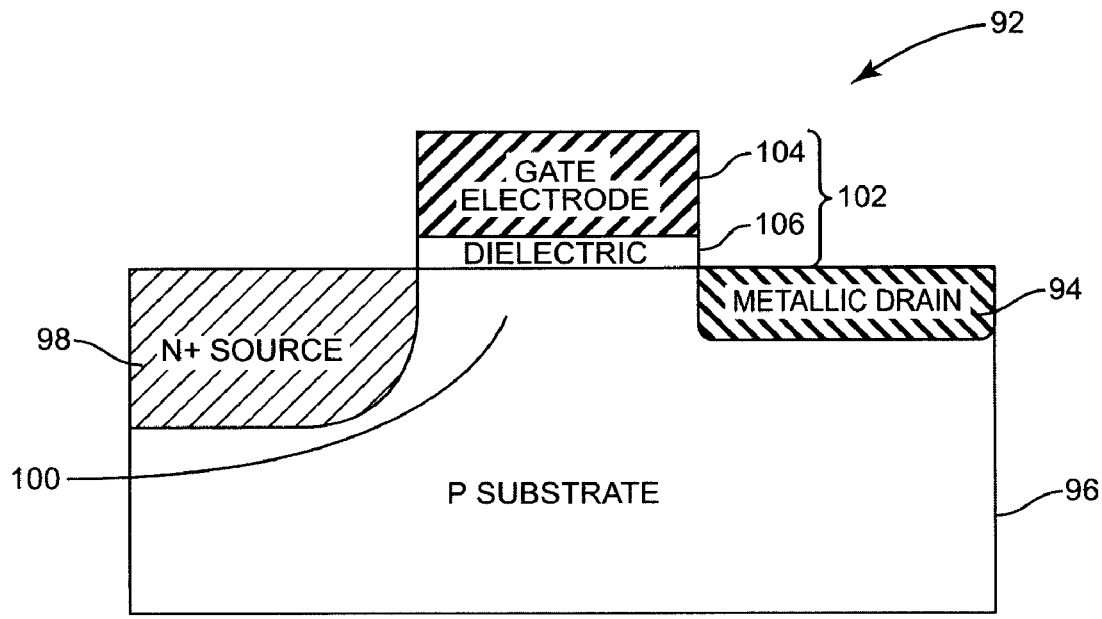
FIG. 11 illustrates a tunneling transistor having a metallic drain according to one embodiment of this disclosure.

FIG. 11 illustrates a tunneling transistor 92 having a metallic drain 94 according to one embodiment of this disclosure. As illustrated, in this embodiment, the tunneling transistor 92 includes a substrate 96, an N+ source region 98, the metallic drain 94, a channel region 100, and a gate stack 102 including a metallic gate electrode 104 and a gate dielectric 106, arranged as shown. The metallic drain 94 may be formed of a metal or a metallic compound. For example, the metallic drain 94 may be formed of metallic silicide or germanide. The metallic drain 94 is referred to as a Schottky diode drain and provides for lower series resistance by eliminating a metal/semiconductor contact and a semiconductor region. The reduced series resistance may be desirable for operation at very low $V_{DD}$ and large $I_{ON}$.

Figure 12:
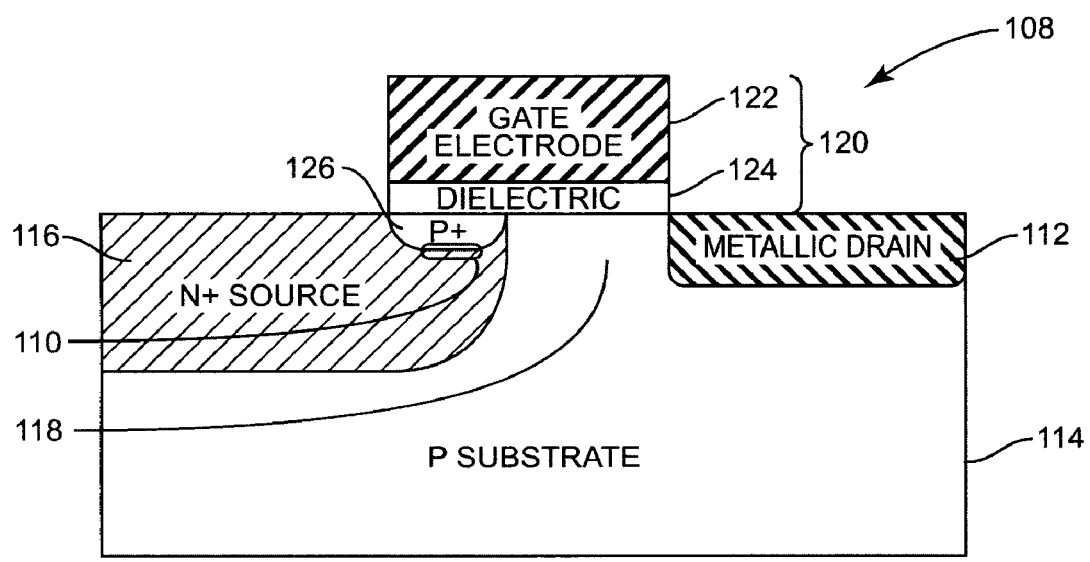
FIG. 12 illustrates a tunneling transistor having a parallel tunneling junction and a metallic drain according to one embodiment of this disclosure.

FIG. 12 illustrates a tunneling transistor 108 having a parallel tunneling junction 110 and a metallic drain 112 according to one embodiment of this disclosure. As illustrated, in this embodiment, the tunneling transistor 108 includes a substrate 114, an N+ source region 116, the metal drain 112, a channel region 118, and a gate stack 120 including a metallic gate electrode 122 that overlaps a portion of the N+ source region 116, and a gate dielectric 124. In addition, the tunneling transistor 108 includes a P+ pocket 126 formed in the N+ source region 116 such that the parallel tunneling junction 110 is substantially parallel with an interface between the metallic gate electrode 122 and the gate dielectric 124. The metallic drain 112 may be formed of a metal or a metallic compound. The metallic drain 112 is referred to as a Schottky diode drain and provides for lower series resistance by eliminating a metal/semiconductor contact and a semiconductor region. The reduced series resistance may be desirable for operation at very low $V_{DD}$ and large $I_{ON}$.

Figure 13:
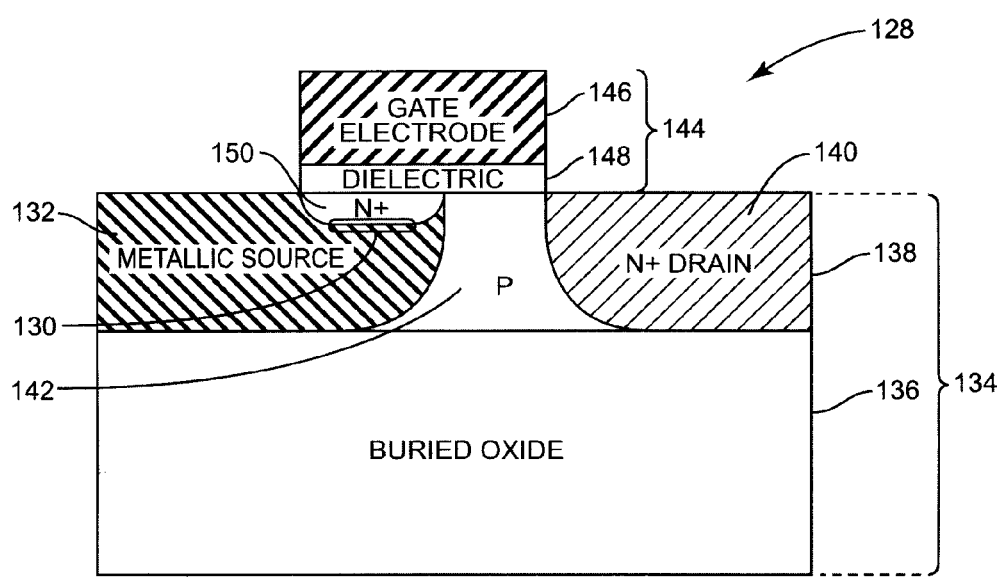
FIG. 13 illustrates a tunneling transistor having a parallel tunneling junction and a metallic source according to one embodiment of this disclosure.

FIG. 13 illustrates a tunneling transistor 128 having a parallel tunneling junction 130 and a metallic source 132 according to one embodiment of this disclosure. As illustrated, the tunneling transistor 128 is formed on a SOI substrate 134 including a buried oxide layer 136 and a semiconductor layer 138. The tunneling transistor 128 includes the metallic source 132 formed in the semiconductor layer 138, an N+ drain region 140 formed in the semiconductor layer 138, a channel region 142 formed in the semiconductor layer 138, and a gate stack 144 including a metallic gate electrode 146 and a gate dielectric 148. In addition, the tunneling transistor 128 includes an P+ pocket 150 formed in the metallic source 132 such that a junction between the P+ pocket 150 and the metallic source 132 provides the parallel tunneling junction 130. The parallel tunneling junction 130 is substantially parallel with an interface between the metallic gate electrode 146 and the gate dielectric 148. The metallic source 132 may be formed of a metal or a metallic compound.

Figures 14A, 14B:
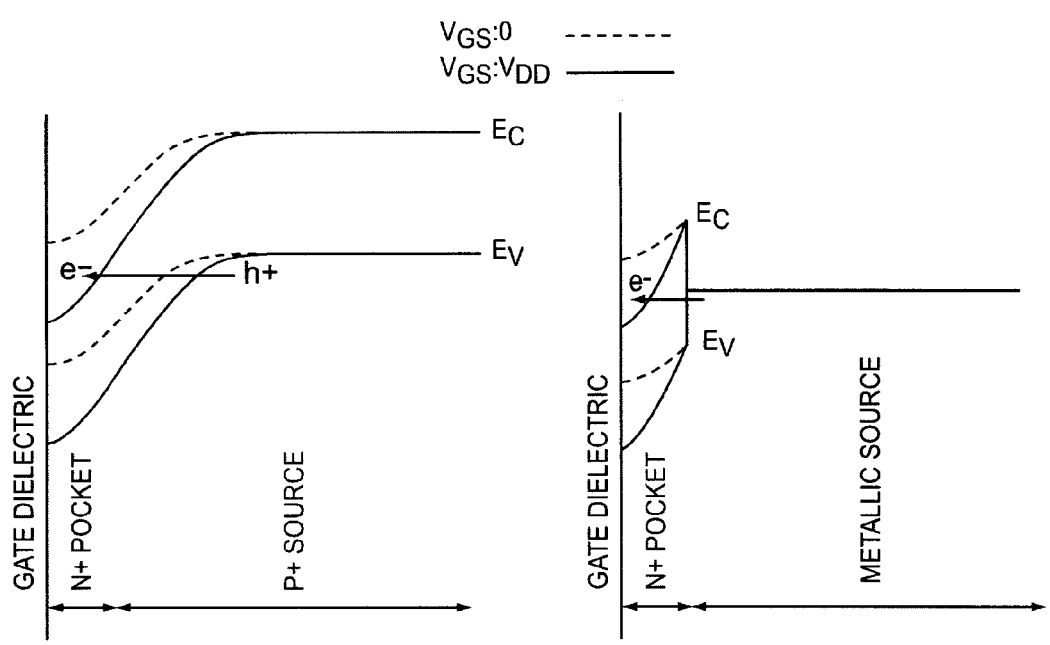
FIGS. 14A and 14B illustrate an energy band diagram of the tunneling transistor of FIG. 13 as compared to that of a tunneling transistor having a P+ source region and an N+ pocket.

FIGS. 14A and 14B are energy band diagrams showing that the tunneling barrier for the metallic source 132 and P+ pocket 150 of FIG. 13 is substantially smaller than that of an N+ pocket and P+ source region. Furthermore, the tunneling barrier is adjustable with the choice of the metal.

Mechanical strain is caused by lattice mismatch between sub-layers of a semiconductor substrate. For example, in a pseudomorphically grown Silicon Germanium (SiGe) layer grown on a Silicon (Si) substrate, mechanical strain results from a lattice mismatch between SiGe and Si. Strain can be generated with a strained cap layer, strained source/drain, strained substrate, strained gate, and so on. Mechanical strain can be employed in the embodiments of a tunneling transistor described herein to improve carrier mobility and on-current ($I_{ON}$). Also, mechanical strain causes shifting of the conduction ($E_C$) and valence band ($E_V$) valleys in energy. Mechanical strain may also result in an enlargement or a reduction of the band gap with the sign of the strain (compressive or tensile). As such, mechanical strain may be used to reduce the band gap of the semiconductor material in order to increase the tunneling rate, which results in improved on-current ($I_{ON}$) for both a vertical tunneling junction and a parallel tunneling junction transistor. While not essential for understanding the application of mechanical strain to a tunneling transistor, an interested reader may refer to S. E. Thompson, et al., Transactions on Electron Devices, vol. 51(11), pp. 1790-1797, 2004, and D. A. Antoniadis, et al., IBM Journal of Research and Development, vol. 50(4/5), pp. 363-376, 2006, which are incorporated herein by reference in their entireties. In addition, the interested reader may refer to R. W. Keyes, IEEE Circuits and Devices Magazine, September, pp. 36-40, 2002, which is incorporated herein by reference in its entirety.

Lower band gap materials can be used for supply voltage reduction because the tunneling rate increases exponentially with decreasing band gap energy. Germanium (Ge) with 0.66 eV bandgap and Indium Arsenide (InAs) with 0.36 eV bandgap are examples of attractive tunneling transistor materials. The Schottky junction option is particularly attractive for these semiconductors.

In order to increase the tunneling current without increasing $V_{GS}$, i.e., without using a large $V_{DD}$, one can increase the capacitive coupling between the gate and the tunneling junction, whether this is the parallel type or the vertical type. The capacitive coupling may be increased by with a dielectric having a high dielectric constant (k), which is referred to herein as a high-k dielectric. As used herein, a high-k dielectric is a dielectric having a dielectric constant (k) greater than that of Silicon Dioxide ($SiO_2$), which is 3.9. As an example, HfSiON is a high-k dielectric. For more information regarding HfSiON, the interested reader is directed to H. S. P. Wong, et al., IBM Journal of Research and Development, vol. 46(2/3), pp. 133-168, 2002, which is incorporated herein by reference in its entirety. Equivalent $SiO_2$ thickness (EOT) of 1 nanometer (nm) or less can be achieved without generating excessive gate leakage current.

Polysilicon gates used in conventional tunneling transistors are known to dissipate a fraction of a volt in their depletion regions. This is a significant loss of the effective $V_{GS}$ when the supply voltage ($V_{DD}$) is only a small fraction of a volt. One can replace the polysilicon gate material with a metallic material such as Titanium Nitride (TiN) or Nickel Silicide ($Ni_2Si$) and eliminate this voltage loss. The tunneling transistor current is more sensitive to changes in $V_{GS}$ than MOSFET, therefore the tunneling transistor can reap particularly large benefits from the use of a metal gate and the high-k dielectrics. A high-k dielectric is particularly attractive when used with low band gap materials such as Germanium (Ge) and InAs because these semiconductors do not form a high quality interface with $SiO_2$ as Silicon (Si) does.

Figure 15:
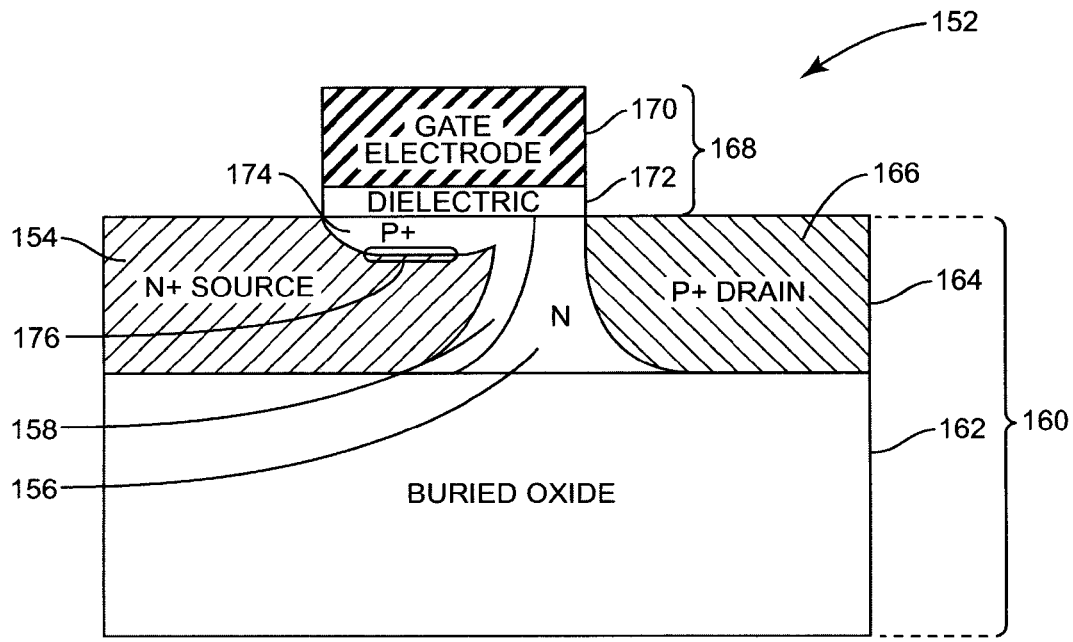
FIG. 15 illustrates a tunneling transistor including an isolation region that electrically isolates a source region of the tunneling transistor according to one embodiment of this disclosure.

FIG. 15 illustrates a tunneling transistor 152 having a source region 154 that is electrically isolated by an isolation region 158 having an opposite doping type as a channel region 156, where the channel region 156 has the same doping type as the source region 154. More specifically, in this embodiment, the tunneling transistor 152 is formed on an SOI substrate 160 including a buried oxide layer 162 and a semiconductor layer 164. The tunneling transistor 152 includes the source region 154, which in this embodiment is an N+ source region, a drain region 166, which in this embodiment is a P+ drain region, the channel region 156, which in this embodiment is an n-type channel region, and a gate stack 168 including a metallic gate electrode 170 and a gate dielectric 172. In this embodiment, the tunneling transistor 152 includes a P+ pocket 174 providing a parallel tunneling junction 176. Further, in this embodiment, the isolation region 158 is an extension of the P+ pocket 174 along a boundary between the source region 154 and the channel region 156.

The source and drain regions 154 and 166 of the tunneling transistor 152 have opposite doping types. Under normal bias condition, the source and drain regions 154 and 166 form a reverse biased diode which does not conduct substantially, and the current through the tunneling transistor 152 consists of the tunneling current. In certain circuits such as a pass-gate, without the isolation region 158, the source-drain voltage polarity may be reversed from the normal such that the source and drain regions 154 and 166 form a forward biased diode that would conduct unwanted current. This unwanted current is eliminated by electrically isolating the source region 154 with the isolation region 158 that has the opposite doping type from the channel region 156, where the channel region 156 has the same doping type as the source region 154.

Figure 16:
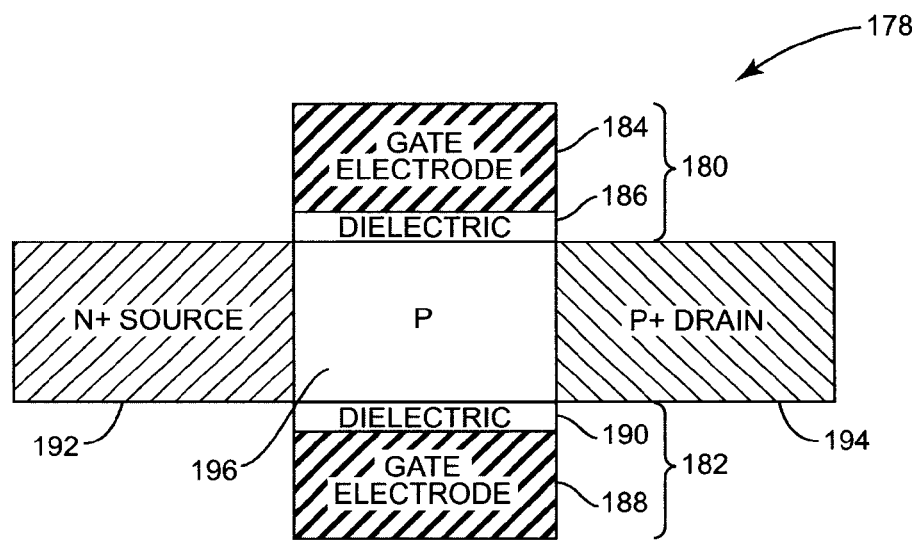
FIG. 16 illustrates a tunneling transistor including multiple gate stacks according to one embodiment of this disclosure.

FIG. 16 illustrates an exemplary tunneling transistor 178 having multiple gate stacks 180 and 182. The gate stack 180 includes a metallic gate electrode 184 and a gate dielectric 186. Likewise, the gate stack 182 includes a metallic gate electrode 188 and a gate dielectric 190. The tunneling transistor 178 includes a source region 192, a drain region 194 having an opposite doping type from the source region 192, and a channel region 196. In one embodiment, the tunneling transistor 178 may include a vertical tunneling junction like or similar to that of the conventional tunneling transistor 10 (FIG. 1). In another embodiment, the tunneling transistor 178 may include a parallel tunneling junction as described herein. Note that the tunneling transistor 178 is exemplary. Numerous variations of a tunneling transistor having multiple gates will be apparent to one of ordinary skill in the art upon reading this disclosure.

Figure 17A:
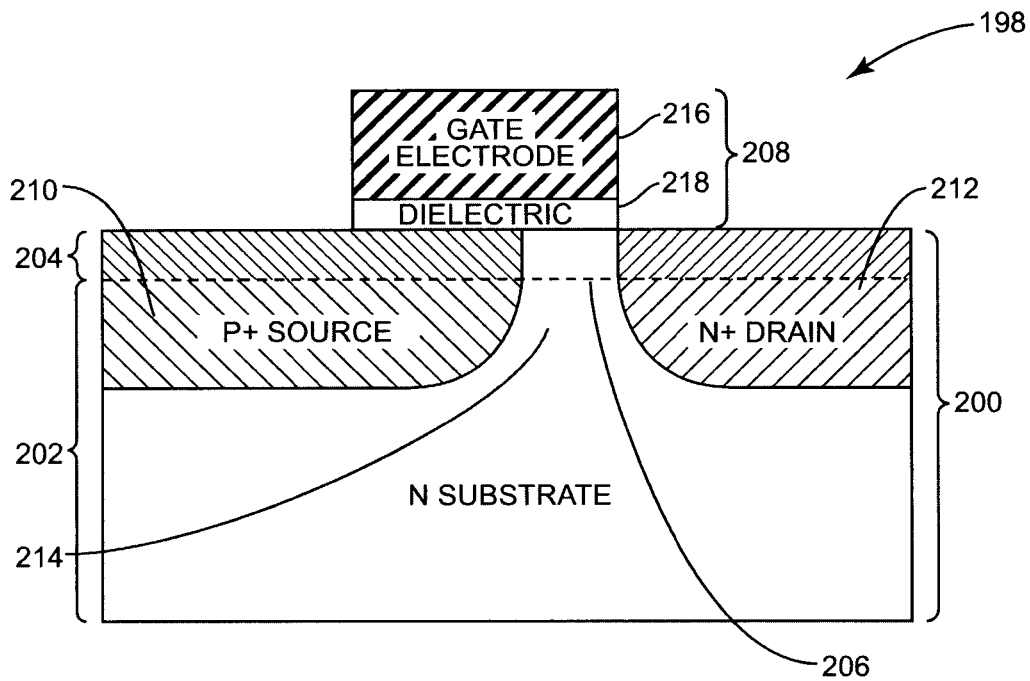
FIGS. 17A and 17B illustrate a heterostructure tunneling transistor according to one embodiment of this disclosure.
Figure 17B:
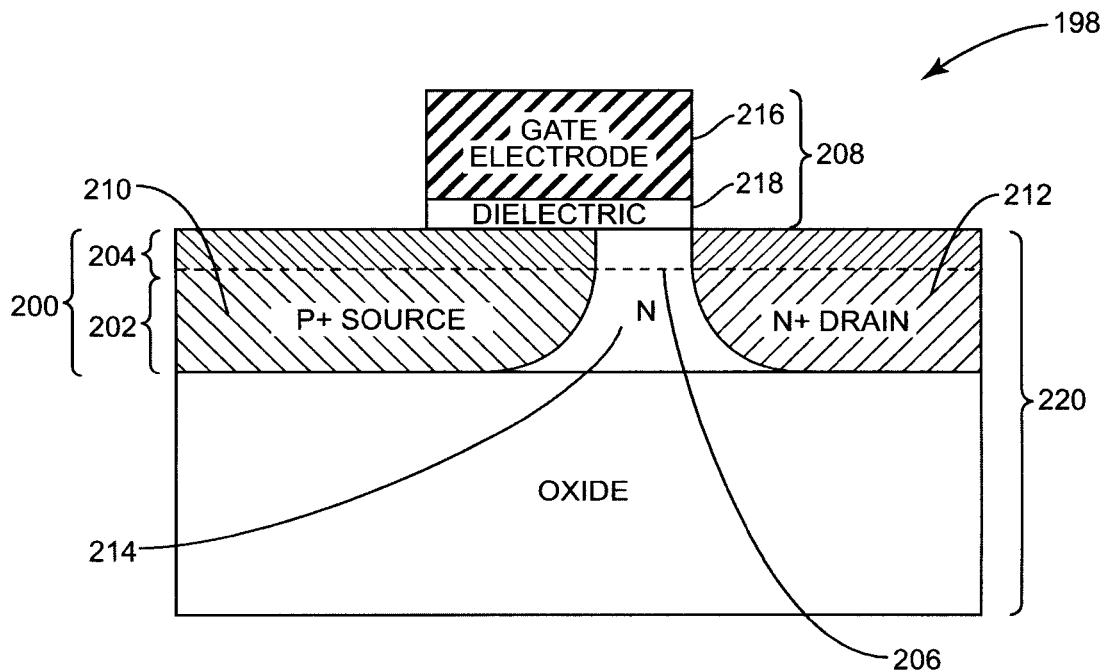

FIGS. 17A and 17B illustrate embodiments of a tunneling transistor that utilize a semiconductor heterostructure to provide a reduced effective band gap, which thereby decreases tunnel barrier height and width. As a result, in one embodiment, scaling of the supply voltage ($V_{DD}$) below 0.8 V is possible with a wide pool of semiconductor material choices. Notably, such scaling is possible without the use of ultra-low band gap low effective-mass materials.

FIG. 17A illustrates an n-channel tunneling transistor 198 including a heterostructure 200 according to one embodiment of this disclosure. In this embodiment, the heterostructure 200 includes a first material 202 and a second material 204 having a metallurgical junction 206. In the preferred embodiment described herein, the first and second materials 202 and 204 are first and second semiconductor materials and are therefore referred to as such for much of this description. However, the present invention is not limited thereto. For instance, the first material 202 may be a semiconductor material and the second material 204 may be a metallic material such as a metal or metal compound, or vice versa. The tunneling transistor 198, which may be referred to herein as an n-channel Hetero-Tunneling Transistor (HTT), includes a P+ source region 210, an N+ drain region 212, a channel region 214, and a gate stack 208 which includes a metallic gate electrode 216 and a gate dielectric 218. The gate stack 208 overlaps the P+ source region 210. In one embodiment, the amount of overlap may be in the rage of 0.5 nm to 200 nm. The metallurgical junction 206 between the first and second semiconductor materials 202 and 204 is parallel to an interface between the metallic gate electrode 216 and the gate dielectric 218.

The second semiconductor material 204 is closer to the gate stack 208 than the first semiconductor material 202. The second semiconductor material 204 acts like a cap material atop the first semiconductor material 202. In one embodiment, the second semiconductor material 204 is a passivating layer. In another embodiment, the second semiconductor material 204 has a thickness less than or equal to 10 nm. In yet another embodiment, the second semiconductor material 204 has a thickness less than or equal to 5 nm. The first and second semiconductor materials 202 and 204 are selected to have an $E_C/E_V$ offset at the metallurgical junction 206 between the first and second semiconductor materials 202 and 204 that lowers the tunnel barrier height and width as compared to a homogenous tunnel barrier of the first semiconductor material 202. In one embodiment, the first and second semiconductor materials 202 and 204 form a quantum well that is substantially parallel to the interface between the metallic gate electrode 216 and the gate dielectric 218. The first and second semiconductor materials 202 and 204 may have the same or different band gaps and may be crystalline, amorphous, or polycrystalline materials.

In the n-channel tunneling transistor 198, through capacitive coupling, the gate stack 208 induces tunneling across the first and second semiconductor materials 202 and 204 in a portion of the P+ source region 210 below the gate stack 208. Tunneling across the first and second semiconductor materials 202 and 204 occurs when the valence band ($E_V$) states of the first semiconductor material 202 line up with conduction band ($E_C$) states of the second semiconductor material 204. The second semiconductor material 204 may be a thin (e.g., $\leq 5$ nm) semiconductor layer in order to produce a high electric field across the metallurgical junction 206 between the first and second semiconductor materials 202 and 204.

The tunnel barrier determines the tunneling probability and $I_{ON}$ of the tunneling transistor 198. Using the first and second semiconductor materials 202 and 204 with appropriate $E_C/E_V$ offset at the metallurgical junction 206 lowers the tunnel barrier height and width compared to a homogenous tunnel barrier of the first semiconductor material 202. Use of the heterostructure 200 in the P+ source region 210 is similar to using a semiconductor with an effective band gap ($E_{g,eff}$) of:

$$E_{g,eff} = (E_{g,electron\text{-}emitting\text{-}side} - \Delta\chi_{AB}),$$

where $E_{g,electron\text{-}emmitting\text{-}side}$ is the band gap of the one of the first and second semiconductor materials 202 and 204 that emits electrons during tunneling and $\Delta\chi_{AB}$ is the difference between the electron affinities ($\chi$) of the first and second semiconductor materials 202 and 204.

FIG. 17B illustrates the tunneling transistor 198 implemented on a SOI substrate 220 rather than a bulk semiconductor substrate according to one embodiment of this disclosure. Otherwise, the tunneling transistor 198 of FIG. 17B is the same as described above with respect to FIG. 17A. FIG. 17B is to illustrate that the tunneling transistor 198 may be implemented on various types of substrates such as a semiconductor substrate such as Silicon (Si), a substrate formed of one or more organic materials, or a layered substrate such as an SOI substrate or a Germanium on Insulator (GeOI) substrate.

Figure 18:
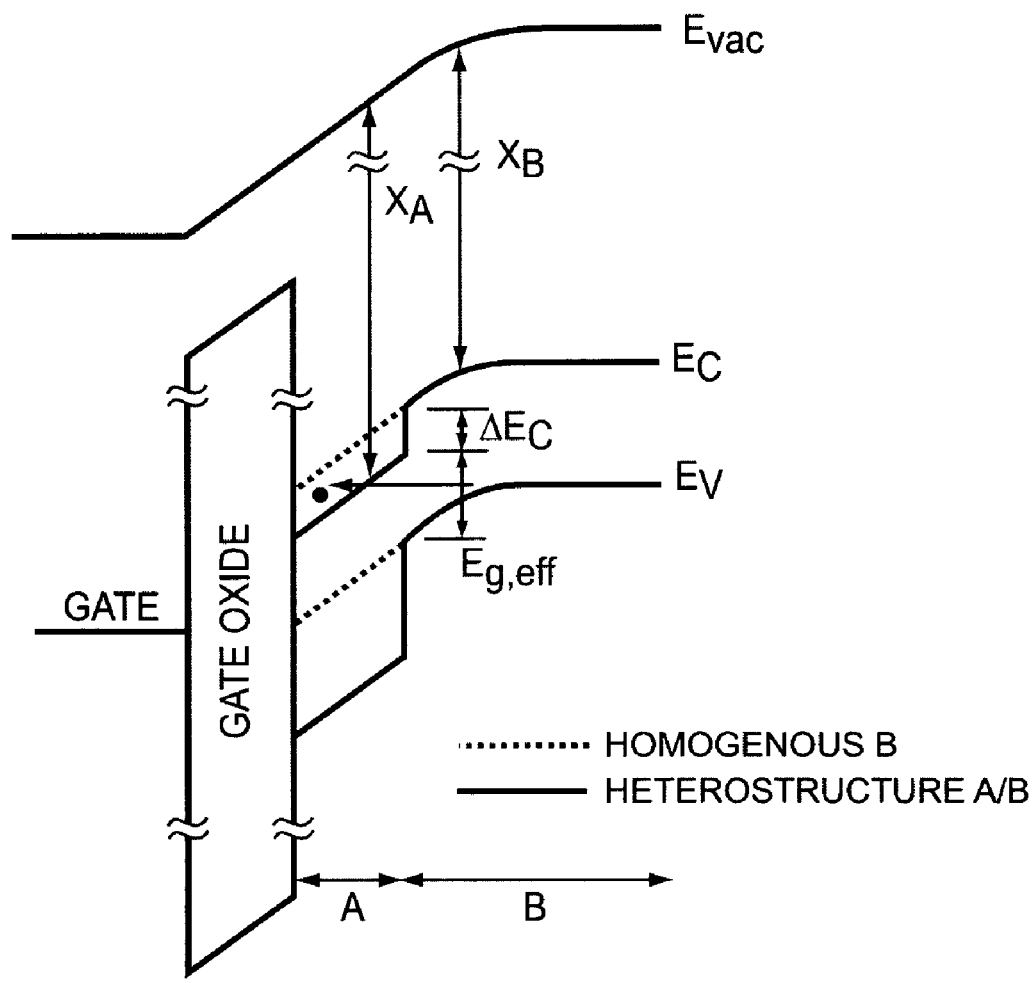
FIG. 18 is an energy band diagram of the heterostructure tunneling transistor of FIGS. 17A and 17B.

FIG. 18 is an energy band diagram illustrating an $E_C/E_V$ offset at the metallurgical junction 206 of the first and second semiconductor materials 202 and 204 of FIGS. 17A and 17B. More specifically, in this example, the second semiconductor material 204 is referred to as material A, and the first semiconductor material 202 is referred to as material B. Specifically, FIG. 18 illustrates that, in the on-state, a positive $V_{GS}$ pulls down the surface potential of the second semiconductor material 204 (material A) through capacitive coupling until valence band ($E_V$) states of the first semiconductor material 202 (material B) align with conduction band ($E_C$) states of the second semiconductor material 204 (material A), which results in substantial electron tunneling from the valence band ($E_V$) of the first semiconductor material 202 (material B) to the conduction band ($E_C$) of the second semiconductor material 204 (material A).

FIG. 18 also illustrates that an $E_C$ offset ($\Delta E_C$) at the metallurgical junction 206 of the heterostructure 200 lowers the tunnel barrier height and width to below that of the homogenous semiconductor tunnel transistor case. As shown, if $E_C$ of the second semiconductor material 204 (material A) is lower than that of the first semiconductor material 202 (material B), the $E_C$ offset ($\Delta E_C$) at the metallurgical junction 206 of the heterostructure 200 ensures that the tunnel barrier of the tunneling transistor 198 has lesser width and height than in the case of a homogenous semiconductor tunnel transistor. Tunneling across the heterostructure 200 generates electrons in the second semiconductor material 204 (material A) and holes in the first semiconductor material 202 (material B).

The tunneling generated electrons are swept to the N+ drain region 212 of the tunneling transistor 198, which is reverse biased with respect to the P+ source region 210. The tunneling generated holes create the source current of the tunneling transistor 198.

The first and second semiconductor materials 202 and 204 are selected such that an effective band gap at the metallurgical junction 206 of the heterostructure 200 is less than the band gap of the first semiconductor material 202. The effective band gap ($E_{g,eff}$) is defined as:

$$E_{g,eff} = (E_{g,electron\text{-}emitting\text{-}side} - \Delta\chi_{AB}),$$

where $E_{g,electron\text{-}emmitting\text{-}side}$ is the band gap of the one of the first and second semiconductor materials 202 and 204 that emits electrons during tunneling and $\Delta\chi_{AB}$ is the difference between the electron affinities ($\chi$) of the first and second semiconductor materials 202 (material B) and 204 (material A).

As an example, using Silicon (Si) as the second semiconductor material 204 (material A) and Germanium (Ge) as the first semiconductor material 202 (material B) provides an effective band gap ($E_{g,eff}$) lower than that of Germanium (Ge) and a transistor off-state leakage equal to that of a Germanium (Ge) tunnel transistor. As another example, using Silicon (Si) as the second semiconductor material 204 (material A) and $Si_{(1-y)}Ge_y$ as the first semiconductor material 202 (material B) on a relaxed $Si_{(1-x)}Ge_x$ substrate provides a low effective band gap ($E_{g,eff}$), where x can be equal, less than, or larger than y. The composition of Germanium (Ge) in the relaxed $Si_{(1-x)}Ge_x$ substrate can be tuned appropriately to achieve strain in the second semiconductor material 204 (material A), the first semiconductor material 202 (material B), or both the second semiconductor material 204 (material A) and the first semiconductor material 202 (material B).

It should be noted that mechanical strain may be used to further improve the operation of the tunneling transistor 198. More specifically, straining the channel region 214 enhances carrier mobility and overall drive current. Strain can be generated using a strained cap layer, strained source/drain regions, strained substrate, strained gate, and so on. The tunneling transistor 198 can also benefit from enhanced carrier mobility and $I_{ON}$ by strain. Additionally, strain may be used to cause desired shifts in the conduction ($E_C$) and valence band ($E_V$) valleys in energy in order to provide a reduction of the band gap of a semiconductor. Since tunneling rate increases exponentially with decreasing band gap, improved on-state tunneling currents can be provided by the application of strain to the P+ source region 210 of the tunneling transistor 198.

Placing two semiconductors with different lattice constants on top of each other induces strain in the semiconductors, which in turn will cause shifting of the conduction ($E_C$) and valence band ($E_V$) valleys in energy. As such, the first and second semiconductor materials 202 and 204 and their lattice constant values may be such that strain enhances the $E_C/E_V$ offset and therefore decreases the effective band gap of the P+ source region 210. This again will lead to enhanced on-state current.

Table 1 provides combinations of semiconductor materials suitable for the tunneling transistor 198 of FIGS. 17A and 17B. Note that these combinations may be used in other embodiments of an n-channel tunneling transistor having a heterostructure formed of a combination of semiconductor materials. Again, the second semiconductor material 204 is referred to as "Material A," and the first semiconductor material 202 is referred to as "Material B."

TABLE 1

| Material A | Material B |
|---|---|
| InP | Silicon |
| Silicon | GaSb |
| Silicon | Germanium |
| InSb | Silicon |
| InP | Germanium |
| InAs | Silicon |
| InSb | Germanium |

Figure 19A:
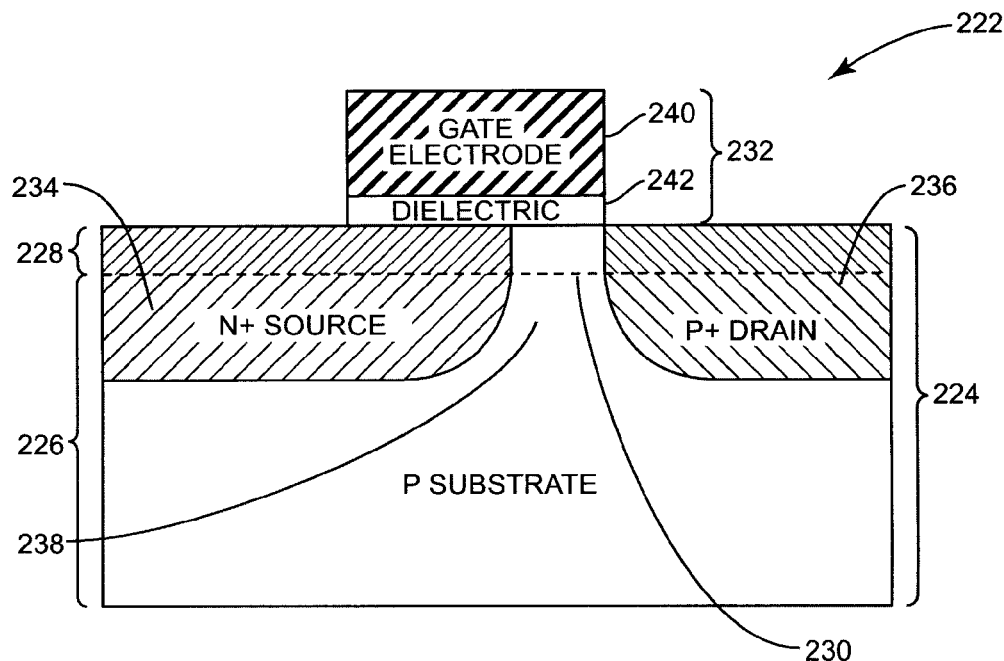
FIGS. 19A and 19B illustrate a p-channel heterostructure tunneling transistor according to one embodiment of this disclosure.

FIG. 19A illustrates a p-channel tunneling transistor 222 including a heterostructure 224 according to one embodiment of this disclosure. In this embodiment, the heterostructure 224 includes a first material 226 and a second material 228 having a metallurgical junction 230. In the preferred embodiment described herein, the first and second materials 226 and 228 are first and second semiconductor materials and are therefore referred to as such for much of this description. However, the present invention is not limited thereto. For instance, the first material 226 may be a semiconductor material and the second material 228 may be a metallic material such as a metal or metal compound, or vice versa. The tunneling transistor 222, which may be referred to herein as a p-channel HTT, includes an N+ source region 234, a P+ drain region 236, a channel region 238, and a gate stack 232 which includes a metallic gate electrode 240 and a gate dielectric 242. The gate stack 232 overlaps the N+ source region 234. In one embodiment, the amount of overlap may be in the rage of 0.5 nm to 200 nm. The metallurgical junction 230 between the first and second semiconductor materials 226 and 228 is parallel to an interface between the metallic gate electrode 240 and the gate dielectric 242.

The second semiconductor material 228 is closer to the gate dielectric 242 than the first semiconductor material 226. In one embodiment, the second semiconductor material 228 is a passivating layer. In another embodiment, the second semiconductor material 228 has a thickness less than or equal to 10 nm.

In yet another embodiment, the second semiconductor material 228 has a thickness less than or equal to 5 nm. Further, the first and second semiconductor materials 226 and 228 are such that the second semiconductor material 228 has an $E_v$ offset with the first semiconductor material 226 because the valence band ($E_V$) edge of the second semiconductor material 228 is closer to the vacuum level than that of the first semiconductor material 226. In one embodiment, the first and second semiconductor materials 226 and 228 form a quantum well that is substantially parallel to the interface between the metallic gate electrode 240 and the gate dielectric 242. The first and second semiconductor materials 226 and 228 may or may not have the same band gap. Further, the first and second semiconductor materials 226 and 228 may be crystalline, amorphous, or polycrystalline.

In the p-channel tunneling transistor 222, through capacitive coupling, the gate stack 232, which may be referred to as a Metal Oxide Semiconductor (MOS) gate, induces tunneling across the first and second semiconductor materials 226 and 228 in a region of the first and second semiconductor materials 226 and 228 below or in-line with the portion of the gate stack 232 that overlaps the N+ source region 234. Tunneling across the first and second semiconductor materials 226 and 228 occurs when the valence band ($E_V$) states of the second semiconductor material 228 line up with the conduction band ($E_C$) states of the first semiconductor material 226. The second semiconductor material 228 may be thin (e.g., ≦5 nm) in order to produce a high electric field across the metallurgical junction 230 of the heterostructure 224.

In the on-state of the tunneling transistor 222, a negative $V_{GS}$ pulls up the surface potential of the second semiconductor material 228 through capacitive coupling until the valence band ($E_V$) states of the second semiconductor material 228 align with conduction band ($E_C$) states of the first semiconductor material 226, resulting in substantial electron tunneling from the valence band ($E_V$) of the second semiconductor material 228 to the conduction band ($E_C$) of the first semiconductor material 226. The first and second semiconductor materials 226 and 228 are selected such that the $E_V$ of the second semiconductor material 228 is closer to vacuum level than the $E_V$ of the first semiconductor material 226. The $E_V$ offset at the metallurgical junction 230 between the first and second semiconductor materials 226 and 228 ensures that the tunnel barrier of the tunneling transistor 222 has lesser width and height than the tunnel barrier in the case of a homogenous semiconductor tunnel transistor. Tunneling across the metallurgical junction 230 of the heterostructure 224 generates electrons in the first semiconductor material 226 and holes in the second semiconductor material 228, and the tunneling generated holes in the second semiconductor material 228 are swept to the P+ drain region 236 of the tunneling transistor 222, which is reverse biased with respect to the N+ source region 234. Germanium (Ge) or $Si_{(1-x)}Ge_x$ as the second semiconductor material 228 and Silicon (Si) as the first semiconductor material 226 can be used to create the p-channel tunneling transistor 222 with an effective band gap ($E_{g,eff}$) lower than that of Germanium (Ge). $Si_{(1-x)}Ge_x$ as the second semiconductor material 228 and Silicon (Si) as first semiconductor material 226 on a relaxed $Si_{(1-y)}Ge_y$ substrate can also be used to create the p-channel tunneling transistor 222 with a low effective band gap ($E_{g,eff}$), where x can be equal, less than, or larger than y. The composition of the $Si_{(1-x)}Ge_x$ substrate can be tuned to achieve strain in both the first and second semiconductor materials 226 and 228, just in the first semiconductor material 226, or just in the second semiconductor material 228.

Figure 19B:
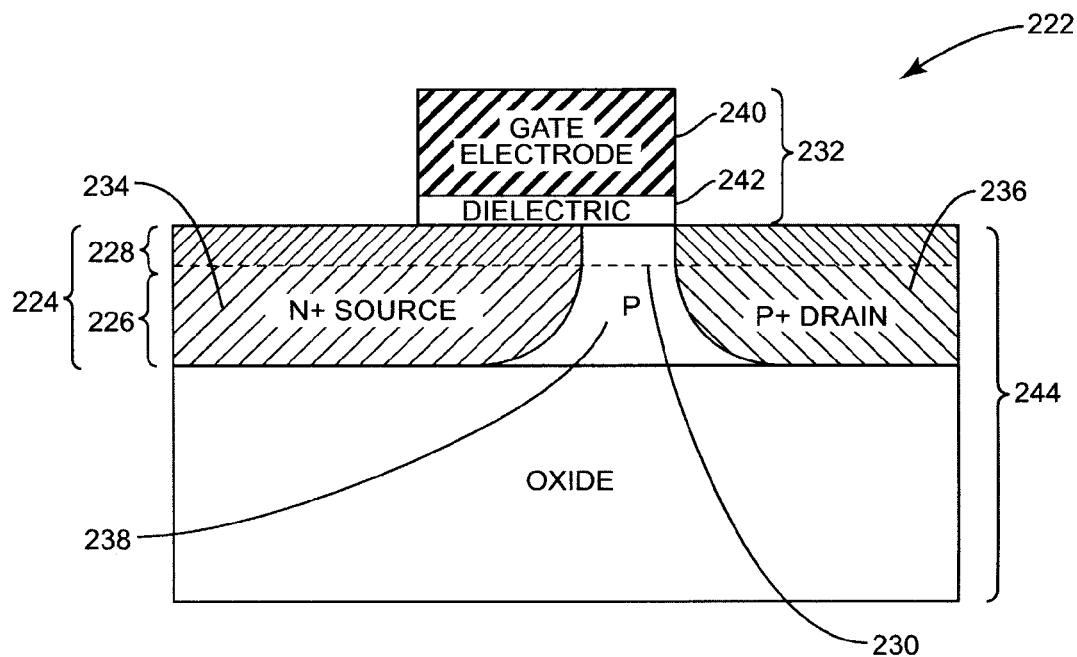

FIG. 19B illustrates the tunneling transistor 222 implemented on a SOI substrate 244 rather than a bulk semiconductor substrate according to one embodiment of this disclosure. Otherwise, the tunneling transistor 222 of FIG. 19B is the same as that described above with respect to FIG. 19A. FIG. 19B is to illustrate that the tunneling transistor 222 may be implemented on various types of substrates such as a semiconductor substrate such as Silicon (Si), a substrate formed of one or more organic materials, or a layered substrate such as an SOI substrate or a GeOI substrate.

Table 2 provides combinations of semiconductor materials suitable for the tunneling transistor 222 of FIGS. 19A and 19B. Note that these combinations may be used in other embodiments of a p-channel tunneling transistor having a heterostructure formed of a combination of semiconductor materials. In Table 2, the second semiconductor material 228 is referred to as "Material A," and the first semiconductor material 226 is referred to as "Material B."

TABLE 2

| Material A | Material B |
|---|---|
| Silicon | InP |
| Germanium | Silicon |
| Silicon | InSb |
| Silicon | InAs |
| Germanium | InP |
| Germanium | InSb |

Figure 20:
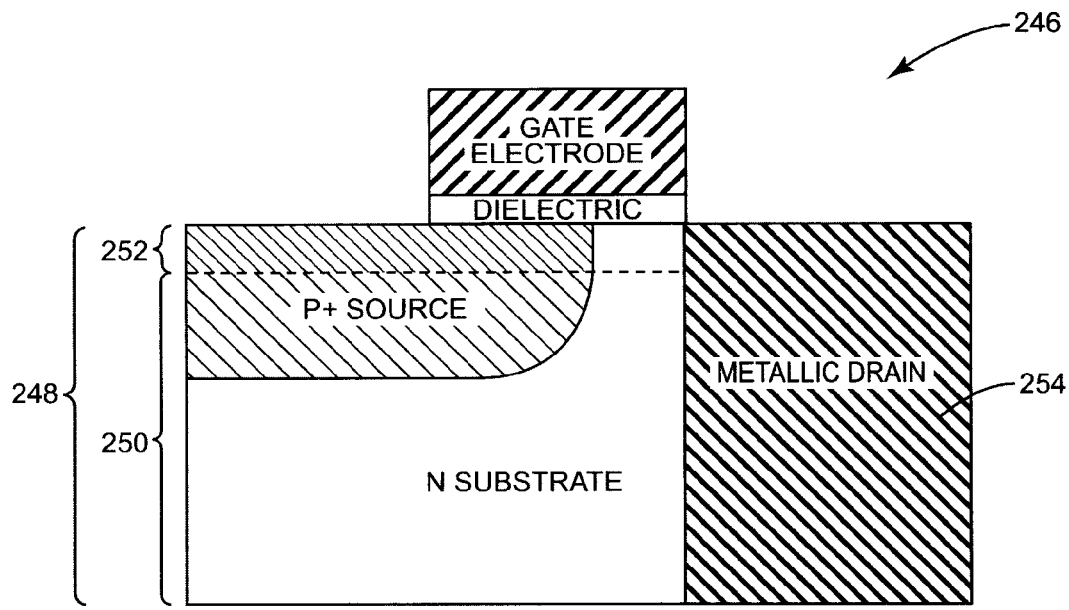
FIG. 20 illustrates a heterostructure tunneling transistor including a metallic drain according to one embodiment of this disclosure.

FIG. 20 illustrates an embodiment of a tunneling transistor 246 including a heterostructure 248 formed of semiconductor materials 250 and 252 and a metallic drain 254. The metallic drain 254 is formed of a metal or metal compound. For example, the metallic drain 254 may be formed of metallic silicide or germanide. The metallic drain 254 provides lower series resistance by eliminating a metal/semiconductor contact and a semiconductor region. A lower series resistance may be desirable to achieve large $I_{ON}$ at ultra low operating voltages.

Figure 21:
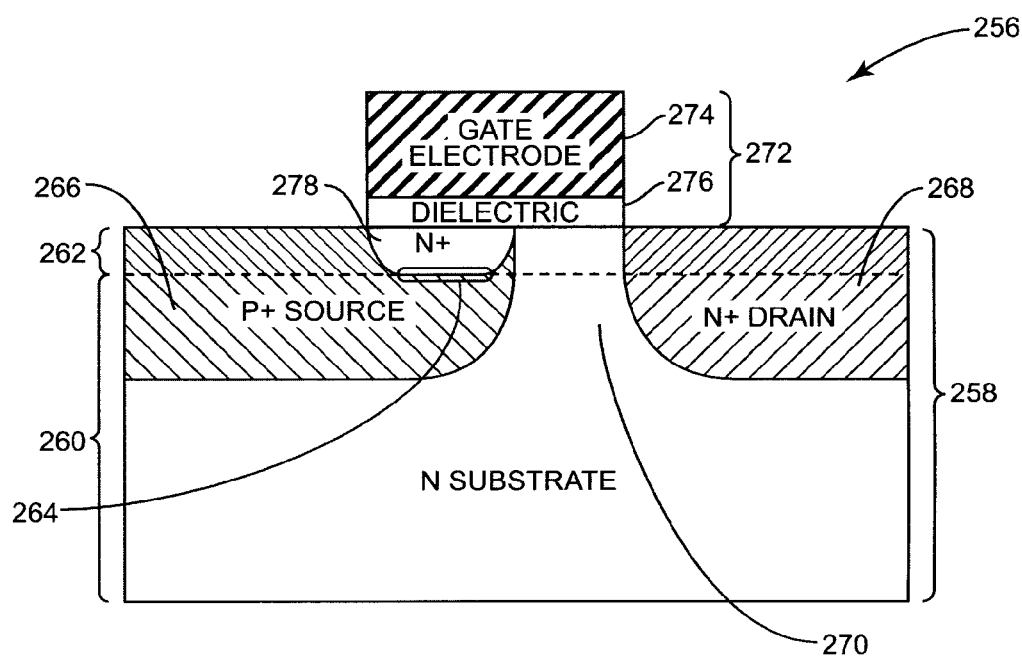
FIG. 21 illustrates a heterostructure tunneling transistor including a pocket of opposite doping type as a source region of the heterostructure tunneling transistor in order to enhance tunneling current according to one embodiment of this disclosure.

FIG. 21 illustrates an embodiment of an n-channel tunneling transistor 256 including a heterostructure 258 formed of semiconductor materials 260 and 262 and a parallel tunneling junction 264. The n-channel tunneling transistor 256 includes a P+ source region 266, an N+ drain region 268, a channel region 270, and a gate stack 272, or gate, formed over the channel region 270 and a portion of the P+ source region 266. The gate stack 272 includes a metallic gate electrode 274 and a gate dielectric 276. In addition, in this embodiment, an N+ pocket 278 is formed in the P+ source region 266. The N+ pocket 278 is floating. More specifically, the N+ pocket 278 is formed at the surface of the portion of the P+ source region 266 over which the gate stack 272 is formed. A PN junction between the P+ source region 266 and the N+ pocket 278 provides the parallel tunneling junction 264. The parallel tunneling junction 264 is substantially parallel to an interface between the metallic gate electrode 274 and the gate dielectric 276. In addition, the parallel tunneling junction 264 is substantially aligned with the portion of the gate stack 272 that overlaps the P+ source region 266. In other words, the parallel tunneling junction 264 is substantially parallel with an interface between the gate stack 272 and the P+ source region 266. As discussed above, the parallel tunneling junction 264 increases the tunneling current in the tunneling transistor 256.

Using dielectrics with dielectric constants larger than that of $SiO_2$ can help increase coupling between the gate stack 272 and the parallel tunneling junction 264 without increasing the gate voltage/supply voltage. High-k dielectrics can then be used to increase the tunneling current of tunneling transistor 256 without increasing the supply voltage. A dielectric such as HfSiON may be used. Using a high-K dielectric, the same EOT can be obtained with a greater physical dielectric thickness and hence lesser gate leakage due to direct tunneling. High-k dielectrics are also attractive when materials other than Silicon (Si) such as Germanium (Ge) or InAs are used.

Depletion of polysilicon gates (used in prior tunneling transistors) wastes a fraction of the applied gate voltage. This loss of $V_{GS}$ can be significant for low voltage operation. Using metal gates such as TiN or Tantalum Nitride (TaN) will eliminate this voltage loss due to depletion in the gate.

Figure 22:
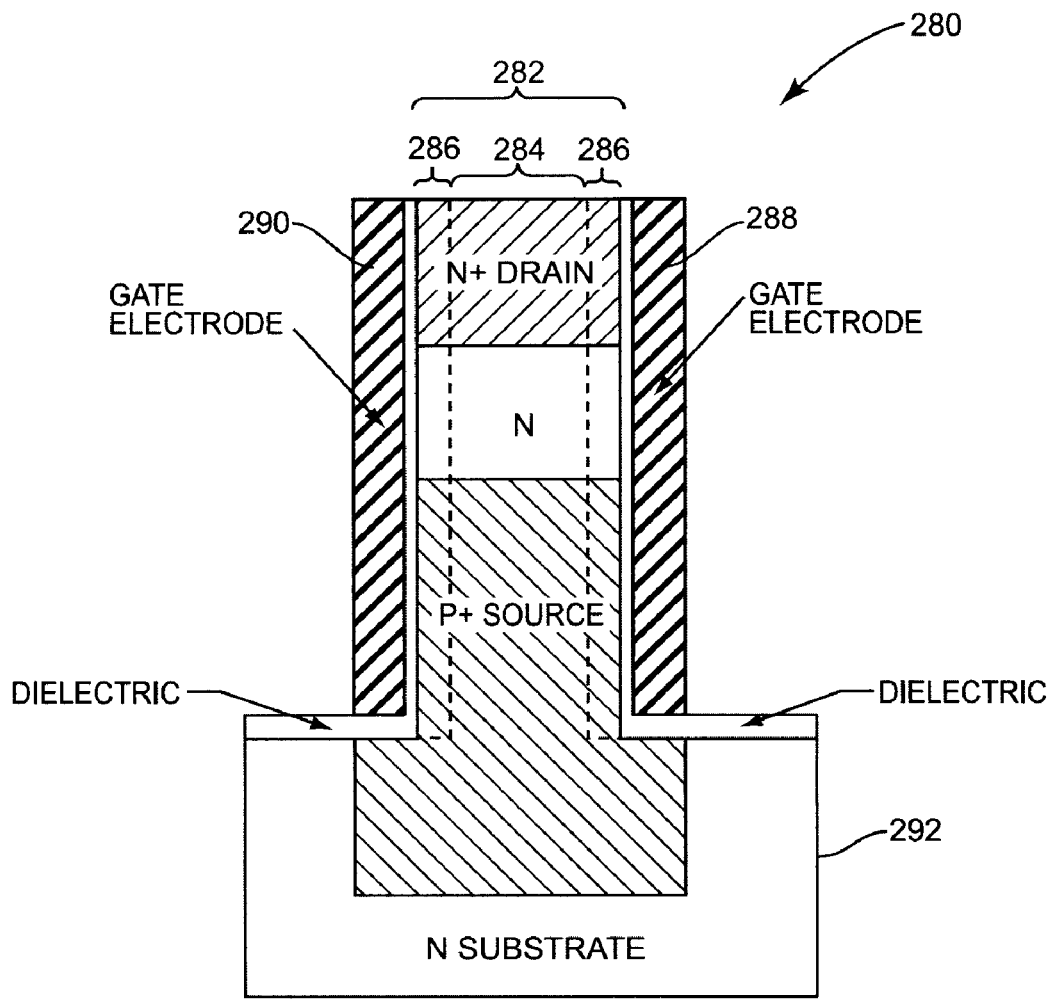
FIG. 22 illustrates a heterostructure tunneling transistor according to another embodiment of this disclosure.

FIG. 22 illustrates a double gated tunneling transistor 280 including a heterostructure 282 formed by semiconductor materials 284 and 286. As illustrated, the tunneling transistor 280 includes two gate stacks 288 and 290. The multiple gate stacks 288 and 290 improve gate control of the channel potential and provide larger on-state current (e.g., two times for a double gate) without increasing the footprint of the tunneling transistor 280. In this embodiment, the tunneling transistor 280 uses a fin-like structure, which stands vertically above a substrate 292. Similar fin-like structures surrounded on all three sides by gates can be implanted for enhanced current and improved gate control.

Figure 23:
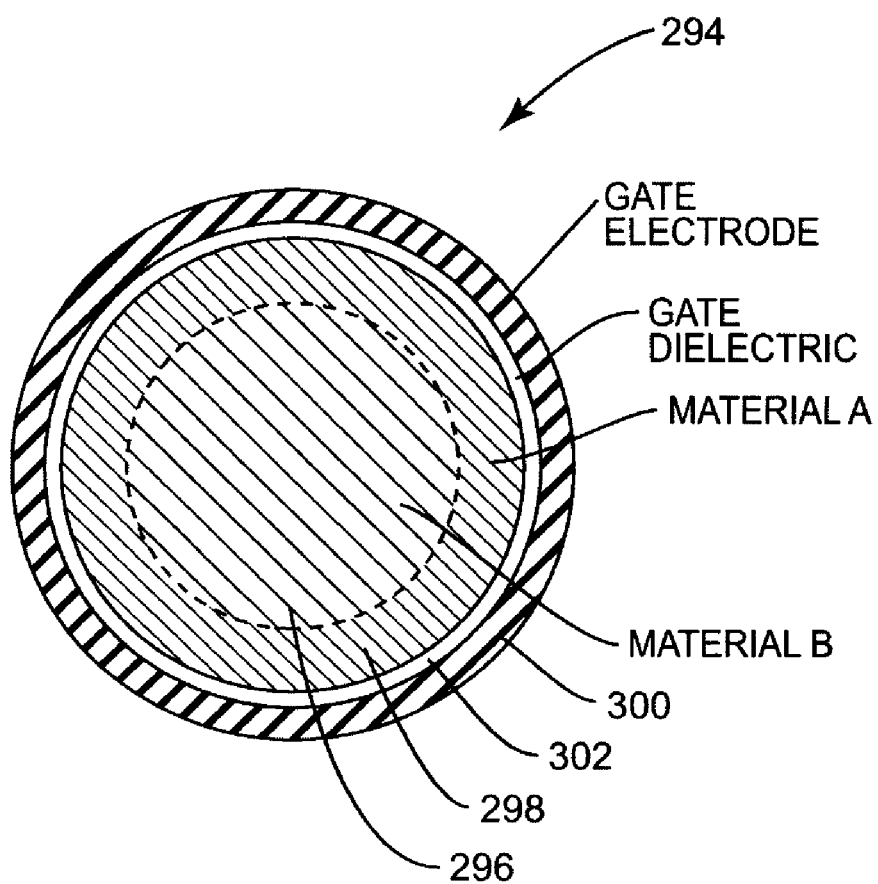
FIG. 23 illustrates a nanowire implementation of a tunneling transistor according to one embodiment of this disclosure.

FIG. 23 illustrates a tunneling transistor 294 including a heterostructure formed by semiconductor materials 296 and 298 implemented as a nanowire or nanotube. In this embodiment, the tunneling transistor 294 has 360-degree coverage of the channel region and a portion of the source region by a gate stack including a metallic gate electrode 300 and a gate dielectric 302.

Figure 24:
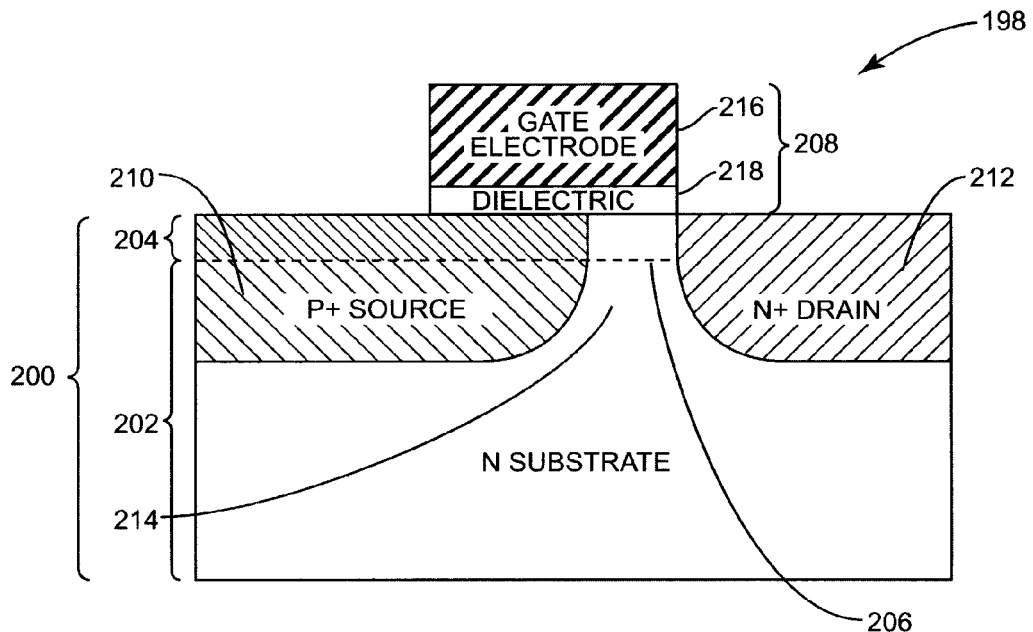
FIG. 24 illustrates a source and channel only heterostructure tunneling transistor according to one embodiment of this disclosure.

Note that in many of the embodiments discussed above, the heterostructure is used for the source, channel, and drain regions of the tunneling transistor. However, this disclosure is not limited thereto. Using the tunneling transistor 198 of FIGS. 17A and 17B as an example, the P+ source region 210, the N+ drain region 212, and the channel region 214 are formed in the first and second semiconductor materials 202 and 204 of the heterostructure 200. However, FIG. 24 illustrates an alternative embodiment of the tunneling transistor 198 wherein only the P+ source and channel regions 210 and 214 are implemented in the first and second semiconductor materials 202 and 204 of the heterostructure 200. The N+ drain region 212 may be implemented in the first semiconductor material 202, the second semiconductor material 204, or a semiconductor material that is different than the first and second semiconductor materials 202 and 204. In an alternative embodiment, the N+ drain region 212 may be implemented as a metallic drain.

Figure 25:
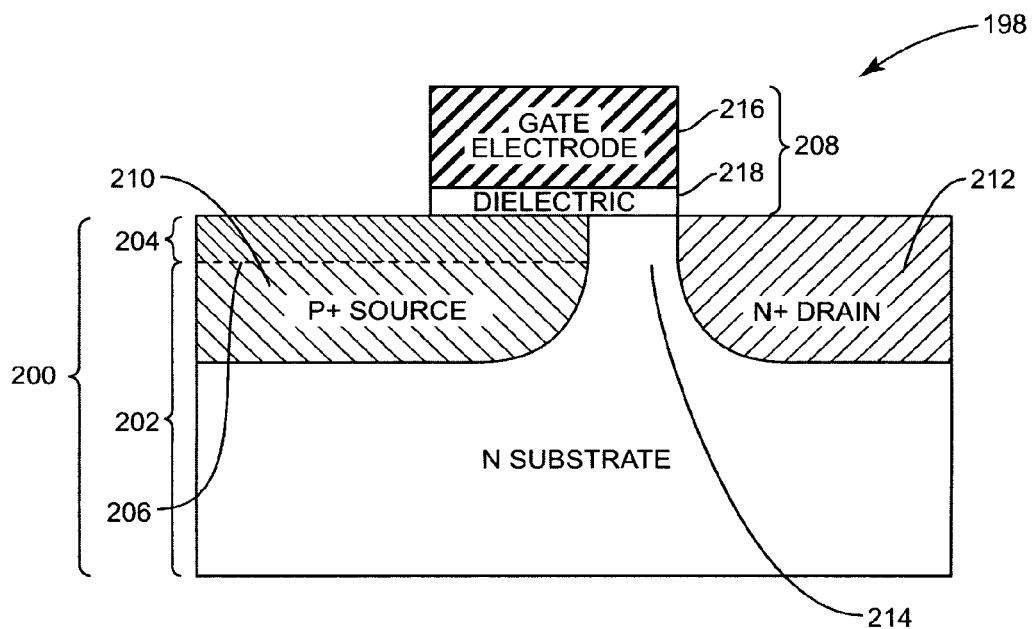
FIG. 25 illustrates a source only heterostructure tunneling transistor according to one embodiment of this disclosure.
Figure 26:
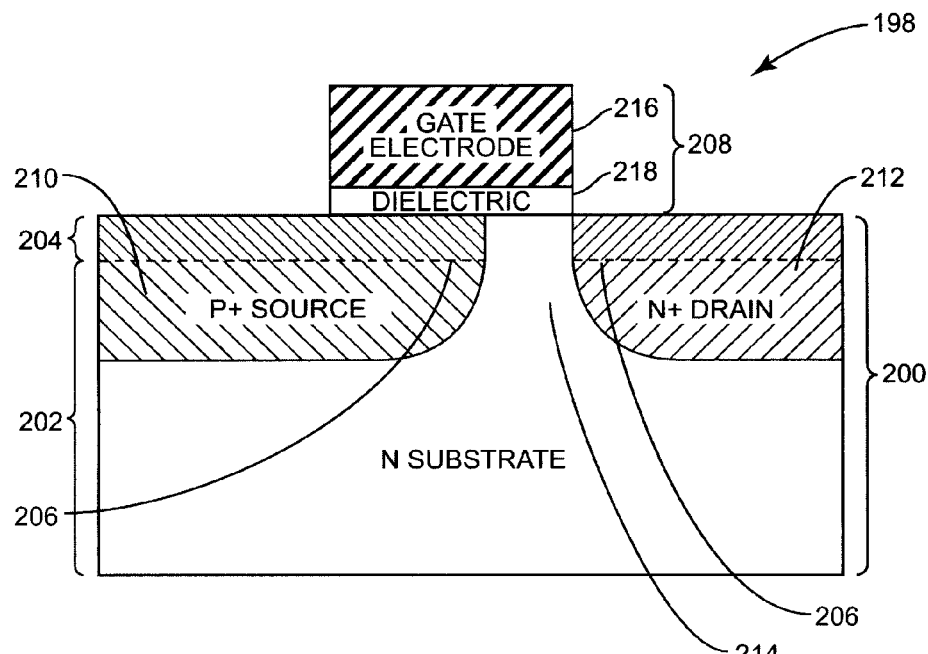
FIG. 26 illustrates a source and drain only heterostructure tunneling transistor according to one embodiment of this disclosure.

FIG. 25 illustrates an alternative embodiment of the tunneling transistor 198 wherein only the P+ source region 210 is implemented in the first and second semiconductor materials 202 and 204 of the heterostructure 200. The N+ drain region 212 may be implemented in the first semiconductor material 202, the second semiconductor material 204, or a semiconductor material that is different than the first and second semiconductor materials 202 and 204. In an alternative embodiment, the N+ drain region 212 may be implemented as a metallic drain. Lastly, FIG. 26 illustrates an alternative embodiment of the tunneling transistor 198 wherein only the P+ source and N+ drain regions 210 and 212 are implemented in the first and second semiconductor materials 202 and 204 of the heterostructure 200.

Figure 27:
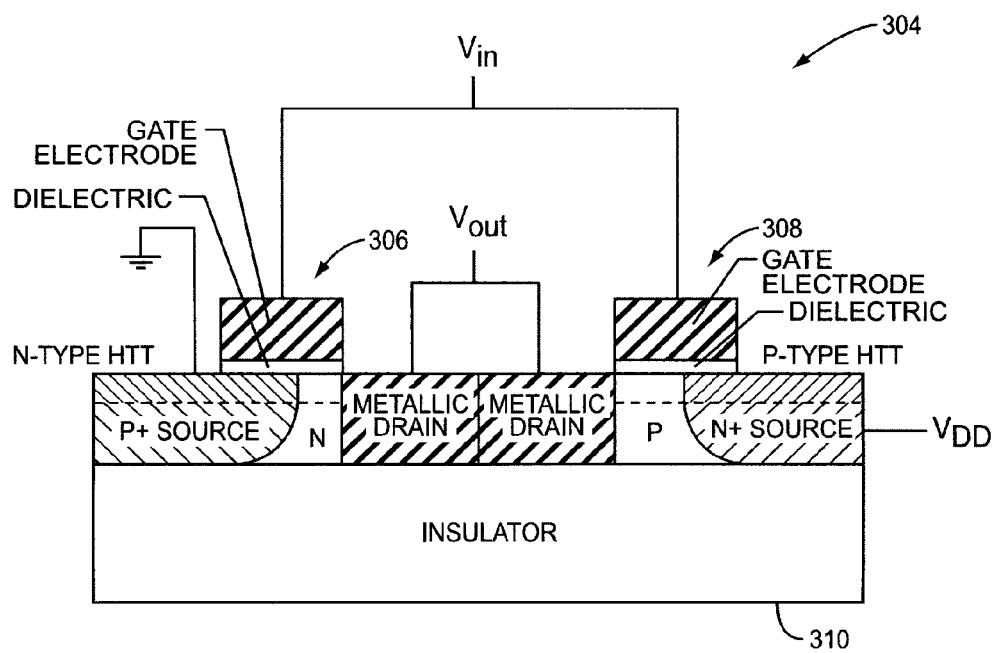
FIG. 27 illustrates an exemplary inverter implemented from two heterostructure tunneling transistors according to one embodiment of this disclosure.

Multiple HTTs can be integrated on a common substrate for integrated circuits. As an example, FIG. 27 illustrates an inverter 304 using two HTTs 306 and 308 on an insulating substrate 310. Electrical isolation among the HTTs 306 and 308 may be achieved with PN junctions or SOI substrates, as is well known to one of ordinary skill in the art.

Figure 28:
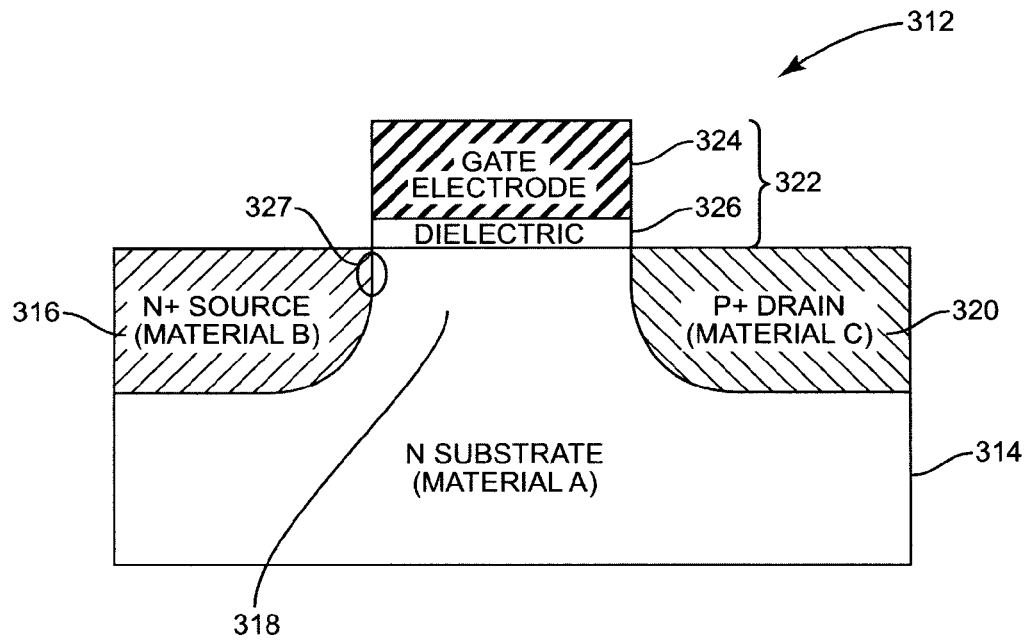
FIG. 28 is a heterostructure tunneling transistor according to another embodiment of this disclosure.

FIGS. 28-31 illustrate embodiments of a tunneling transistor 312 according to additional embodiments of this disclosure. More specifically, FIG. 28 illustrates an embodiment of the tunneling transistor 312 including a substrate 314 formed of a first semiconductor material A, a source region 316 formed of a second semiconductor material B, a channel region 318, and a drain region 320 formed of a third semiconductor material C. In an alternative embodiment, the source and drain regions 316 and 320 are formed of the same semiconductor material. The first, second, and third semiconductor materials A, B, and C form a heterostructure. While in FIG. 28 the materials A, B, and C are all semiconductor materials, the present invention is not limited therefore. Depending on the particular embodiment, each of the semiconductor materials A, B, and C may be either a semiconductor material or a metallic material. The tunneling transistor 312 also includes a gate stack 322 including a metallic gate electrode 324 and a gate dielectric 326. In one embodiment, a metallurgical junction 327 between the first and second semiconductor materials A and B may be located within 10 nm to 20 nm from an edge of the gate stack 322. Also, an N+/N interface between the N+ source region 316 and the channel region 318 substantially coincides with the metallurgical junction 327 between the first and second semiconductor materials A and B.

In one embodiment, electron affinities and $E_C/E_V$ offsets between the first and second semiconductor materials A and B is such that an effective band gap ($E_{g,eff}$) between the first and second semiconductor materials A and B is less than 0.67 eV. Also, strain may be used to retain a lowered effective band gap ($E_{g,eff}$) and/or process induced strain may be used to enhance tunneling current. Also, in one embodiment, once the metallurgical junction 327 has been created by epitaxial growth, the tunneling transistor 312 is not subjected to high temperature processing during fabrication, thereby limiting diffusion of the first and second semiconductor materials A and B into each other by less than 10 nm, which prevents strain relaxation in either of the first and second semiconductor materials A and B.

Figure 29:
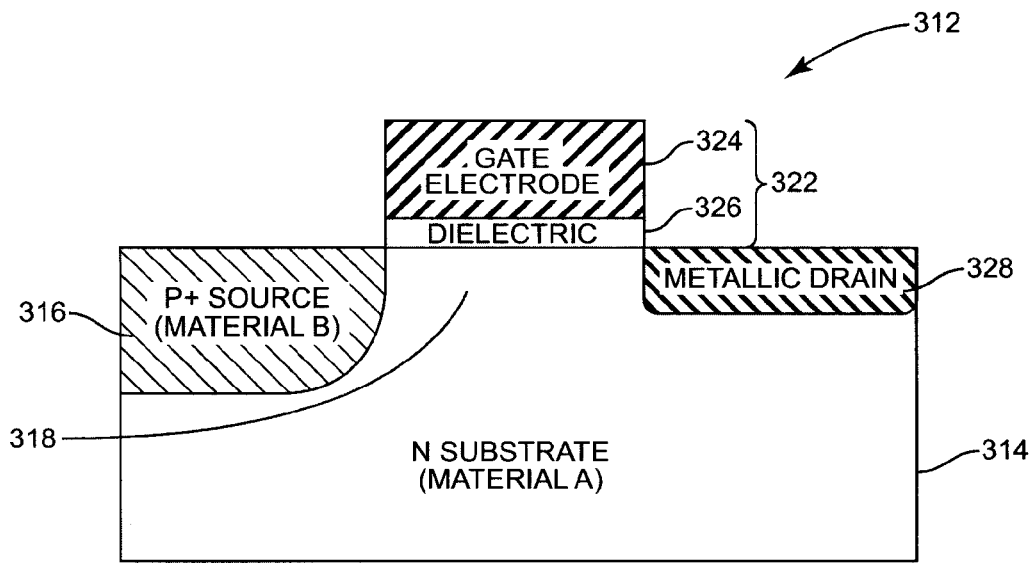
FIG. 29 is a heterostructure tunneling transistor according to another embodiment of this disclosure.

FIG. 29 illustrates an embodiment of the tunneling transistor 312 that is substantially the same as that of FIG. 28. However, in the embodiment of FIG. 29, the P+ drain region 320 (FIG. 28) is replaced with a metallic drain 328.

Figure 30:
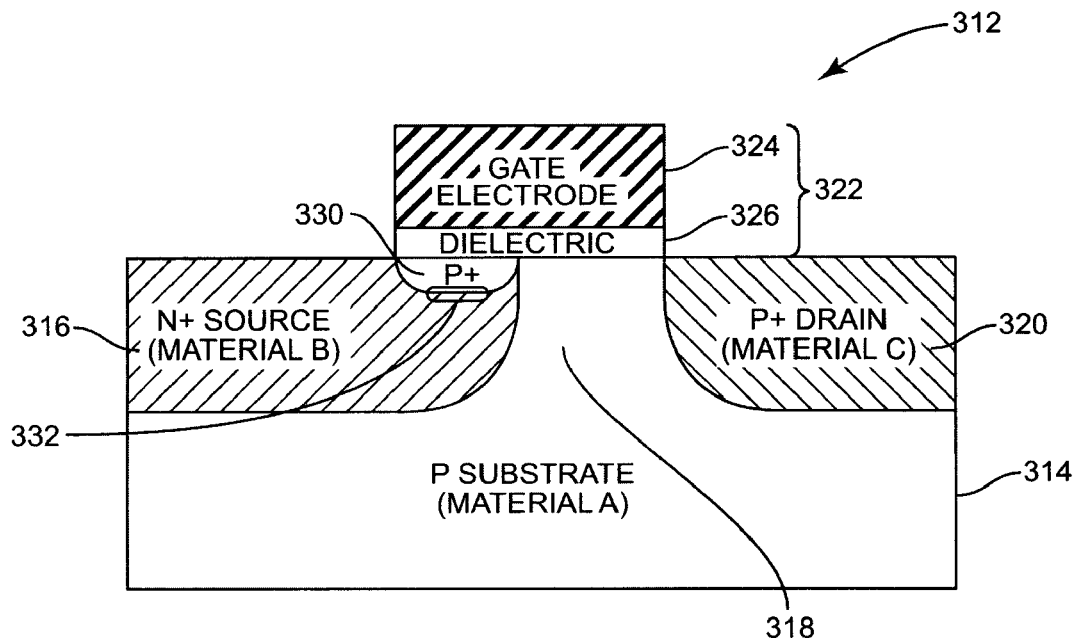
FIG. 30 is a heterostructure tunneling transistor according to another embodiment of this disclosure.

FIG. 30 illustrates an embodiment of the tunneling transistor 312 that is similar to that of FIG. 28. However, in this embodiment, the tunneling transistor 312 further includes a P+ pocket 330 providing a parallel tunneling junction 322, which improves an on-current ($I_{ON}$) of the tunneling transistor 312. The P+ pocket 330 may have a doping level greater than $10^{18}$ atoms/cm$^3$. In one embodiment, the P+ pocket 330 has a thickness less than 20 nm. In addition, the gate stack 322 overlaps a portion of the N+ source region 316 in which the P+ pocket 330 is formed.

Figure 31:
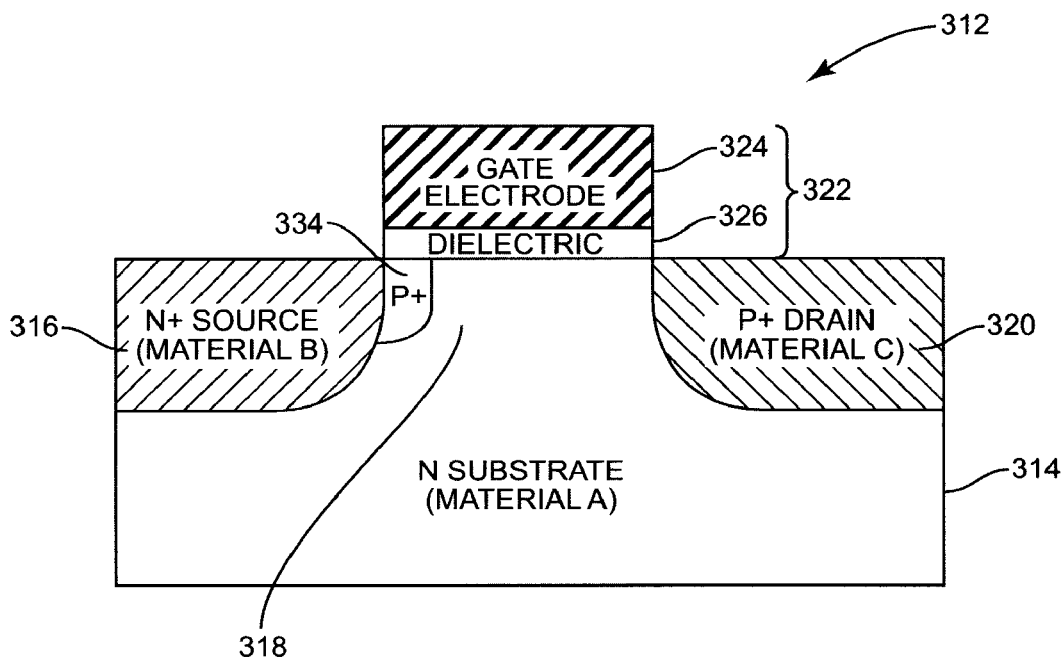
FIG. 31 is a heterostructure tunneling transistor according to another embodiment of this disclosure.

FIG. 31 illustrates an embodiment of the tunneling transistor 312 that is similar to that of FIG. 30. However, in this embodiment, the P+ pocket 330 is formed in the channel region 318 such that the P+ pocket 330 is adjacent to and touching, or adjoining, the N+ source region 316. The gate stack 322 is formed over the channel region 318 including the P+ pocket 330. In one embodiment, the P+ pocket 330 has a width less than 20 nm.

With respect to FIGS. 28-31, depending on the embodiment, the gate stack 322 may overlap the N+ source region 316. In one exemplary embodiment, the gate stack 322 may overlap the N+ source region 316 by a distance in the range of and including 0.5 nm to 200 nm.

Figure 32:
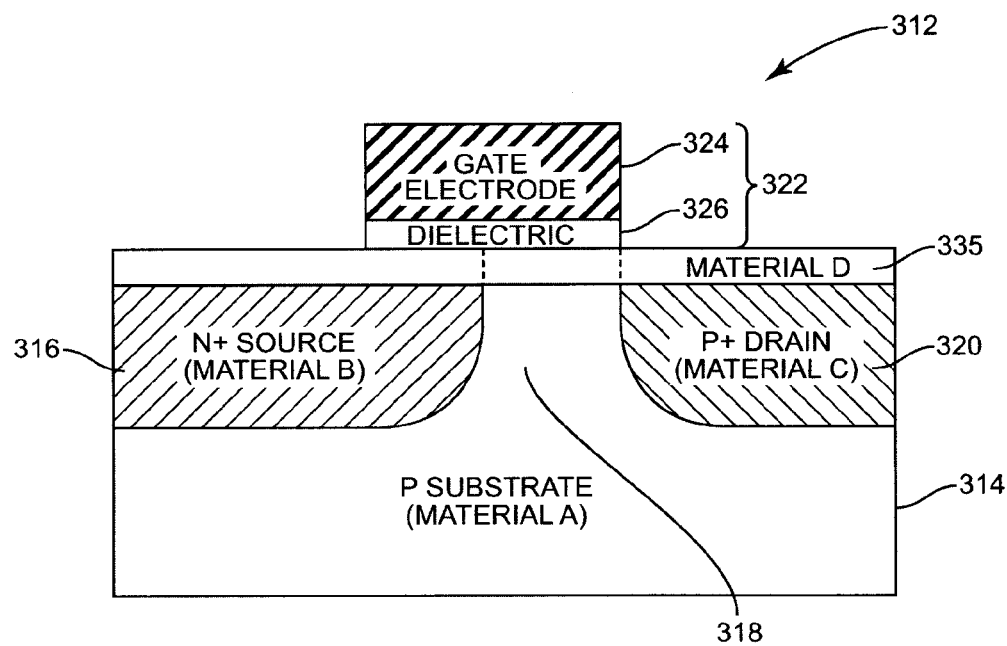
FIG. 32 is a heterostructure tunneling transistor according to another embodiment of this disclosure.

FIG. 32 illustrates another embodiment of the tunneling transistor 312. In general, this embodiment of the tunneling transistor 312 also includes a parallel metallurgical junction as described above with respect to, for example, FIGS. 17A and 17B. As discussed above, the tunneling transistor 312 includes the substrate 314 formed of the first semiconductor material A, the source region 316 formed of the second semiconductor material B, the channel region 318, and the drain region 320 formed of the third semiconductor material C. In an alternative embodiment, the source and drain regions 316 and 320 are formed of the same semiconductor material. In this embodiment, the tunneling transistor 312 also includes a cap layer 335 formed of a material D, which may be a semiconductor material or a metallic material such as a metal or metal compound. The materials A, B, C, and D form a heterostructure. While in FIG. 32 the materials A, B, and C are all semiconductor materials, the present invention is not limited thereto. Depending on the particular embodiment, each of the semiconductor materials A, B, and C may be either a semiconductor material or a metallic material.

Figure 33:
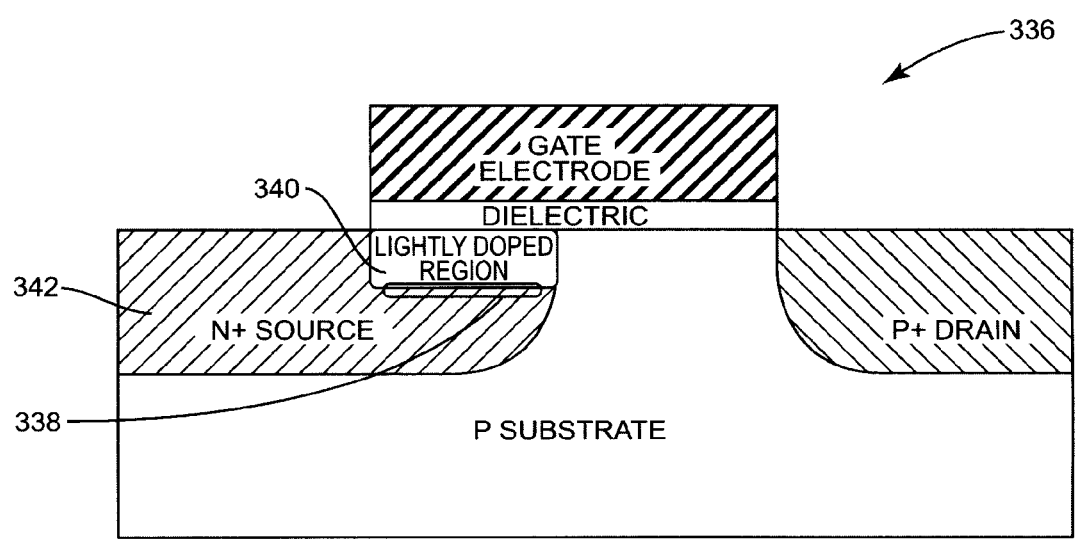
FIG. 33 illustrates another embodiment of a tunneling transistor including a parallel tunneling junction.

In this embodiment, a portion of a parallel metallurgical junction between the materials B and D is overlapped by the gate stack 322. As a result, electron tunneling may be induced across the parallel metallurgical junction between the materials B and D in the source region 316. While in this embodiment the cap layer 335 spans across the source, channel, and drain regions 316-320, the present invention is not limited thereto. Much in the same manner as illustrated in FIGS. 24-26, the cap layer 335 may alternatively be formed for only the source region 316, only the source and channel regions 316 and 318, or only the source and drain regions 316 and 320. Note that other variations of the tunneling transistor 312 of FIG. 32 are possible. For instance, the tunneling transistor 312 of FIG. 32 may also include a P+ or N+ pocket as in FIG. 21. FIG. 33 illustrates another embodiment of a tunneling transistor 336 including a parallel tunneling junction 338. In this embodiment, rather than providing the parallel tunneling junction 338 using a highly doped pocket as described above with respect to FIGS. 2A-10, 12-15, 30, and 31, a lightly doped region 340 is formed such that a junction between the lightly doped region 340 and a source region 342 of the tunneling transistor 336 provides the parallel tunneling junction 338. In this embodiment, the lightly doped region 340 may have an opposite doping type as the source region 342, the same doping type as the source region 342, or no doping. The source region 342 is highly doped. In one embodiment, the lightly doped region 340 has a doping level that is at least 10 times less than that of the source region 342.

Tunneling occurring in the lightly doped region 340 may be desired because of reduced random doping fluctuation effects. In addition, uncertainties with apparent band gap narrowing and impurity band states that are common to heavy doping concentrations are avoided when tunneling in the lightly doped region 340. This particular doping profile of a very light doping region atop a heavy doping region is known as a retrograde profile. A retrograde profile allows for high field in the surface region without the need for a large surface doping concentration. In addition, a retrograde profile permits appropriate threshold voltage control. For a transistor with uniform light doping, the threshold is determined by the doping concentration and is too low. However, when using a retrograde profile, the threshold voltage is determined by oxide thickness and lighter doping layer thickness independent of the surface dopant concentration.

Those skilled in the art will recognize improvements and modifications to the embodiments of the present invention. All such improvements and modifications are considered within the scope of the concepts disclosed herein and the claims that follow.

What is claimed is:

1. A tunneling transistor comprising:
    a source region;
    a drain region, an entirety of the source region and an entirety of the drain region being of opposite conductivity types with respect to one another;
    a channel region between the source and drain regions;
    a gate stack that overlaps a portion of the source region; and
    a parallel tunneling junction that is substantially parallel to an interface between the gate stack and the portion of the source region overlapped by the gate stack.

2. A tunneling transistor comprising:
    a source region;
    a drain region, the source region and the drain region being of opposite conductivity types with respect to one another;
    a channel region between the source and drain regions;
    a gate stack that overlaps a portion of the source region;
    a parallel tunneling junction that is substantially parallel to an interface between the gate stack and the portion of the source region overlapped by the gate stack; and
    a pocket of an opposite doping type as the source region formed at a surface of the source region adjacent to the gate stack in the portion of the source region overlapped by the gate stack such that the pocket is positioned between the gate stack and the source region and a junction between the pocket and the source region provides the parallel tunneling junction.

3. The tunneling transistor of claim 2 wherein the pocket and the source region are both highly doped.

4. The tunneling transistor of claim 1 further comprising a lightly doped region formed at a surface of the source region adjacent to the gate stack in the portion of the source region overlapped by the gate stack such that the lightly doped region is positioned between the gate stack and the source region and a junction between the lightly doped region and the source region provides the parallel tunneling junction, wherein the lightly doped region has a doping level that is at least 10 times less than that of the source region.

5. The tunneling transistor of claim 2 wherein the pocket has a thickness less than 15 nanometers (nm).

6. The tunneling transistor of claim 2 wherein the channel region is doped at a doping level below $10^{19}$ atoms/cm$^3$.

7. The tunneling transistor of claim 1 wherein the channel region is doped at a doping level below $10^{19}$ atoms/cm$^3$.

8. The tunneling transistor of claim 1 wherein the gate stack comprises a gate dielectric having a dielectric constant greater than 3.9 and a metallic gate electrode.

9. The tunneling transistor of claim 1 wherein the tunneling transistor is formed on an insulating substrate.

10. The tunneling transistor of claim 1 wherein at least the source region is formed using a semiconductor material having a band gap less than a band gap of pure Silicon.

11. The tunneling transistor of claim 10 wherein the gate stack comprises a gate dielectric having a dielectric constant greater than 3.9 and a metallic gate electrode.

12. The tunneling transistor of claim 10 comprising multiple gate stacks including the gate stack.

13. The tunneling transistor of claim 1 wherein the tunneling transistor is formed in a semiconductor material having a desired mechanical strain.

14. The tunneling transistor of claim 1 wherein the tunneling transistor is a 3-dimensional structure.

15. The tunneling transistor of claim 1 further comprising an isolation region that electrically isolates the source region, wherein the isolation region has an opposite doping type from a doping type of the channel region and the channel region has a same doping type as the source region.

16. A tunneling transistor comprising:
    a source region;
    a drain region, the source region and the drain region being of opposite conductivity types with respect to one another;
    a channel region between the source region and the drain region;
    a gate stack formed at least partially over the channel region;
    a parallel tunneling junction through which a tunneling current is generated when the tunneling transistor is in an on-state; and a pocket of an opposite doping type as the source region formed at a surface of the source region adjacent to the gate stack in a portion of the source region overlapped by the gate stack such that the pocket is positioned between the gate stack and the source region and a junction between the pocket and the source region provides the parallel tunneling junction, wherein at least the source region and the channel region are formed of a low band gap material having a band gap less than that of pure Silicon.

17. The tunneling transistor of claim 1 wherein the parallel tunneling junction is at a surface of the source region in between the source region and the gate stack.

18. The tunneling transistor of claim 3 wherein a doping level for both the pocket and the source region is greater than $10^8$ atoms per $cm^3$.

* * * * *